United States Patent [19]

Kataoka et al.

[11] Patent Number: 5,751,428
[45] Date of Patent: May 12, 1998

[54] EXPOSURE METHOD AND EXPOSURE APPARATUS USING THE SAME

[75] Inventors: Yoshiharu Kataoka; Haruna Kawashima; Yuichi Yamada, all of Utsunomiya, Japan

[73] Assignee: Canon Kabushiki Kaisha, Tokyo, Japan

[21] Appl. No.: 474,325

[22] Filed: Jun. 7, 1995

[30] Foreign Application Priority Data

Jun. 14, 1994 [JP] Japan .................................. 6-131819
Sep. 21, 1994 [JP] Japan .................................. 6-226426

[51] Int. Cl.⁶ ........................................................ G01B 11/00
[52] U.S. Cl. ........................ 356/401; 250/548; 250/559.3
[58] Field of Search ................................... 356/399–401; 250/559.3, 548; 355/43, 53, 55, 77

[56] References Cited

U.S. PATENT DOCUMENTS

| | | | |
|---|---|---|---|
| 4,563,094 | 1/1986 | Yamada | 356/401 |
| 4,655,599 | 4/1987 | Ayata et al. | 356/401 |
| 4,933,715 | 6/1990 | Yamada et al. . | |
| 4,962,423 | 10/1990 | Yamada et al. . | |
| 5,118,957 | 6/1992 | Kawashima et al. . | |
| 5,162,642 | 11/1992 | Akamatsu et al. . | |
| 5,323,016 | 6/1994 | Yamada et al. . | |
| 5,448,332 | 9/1995 | Sakakibara et al. | 356/400 |

FOREIGN PATENT DOCUMENTS 62-140418 6/1987 Japan .
2-102518 4/1990 Japan .

*Primary Examiner*—K. Hantis
*Attorney, Agent, or Firm*—Fitzpatrick, Cella, Harper & Scinto

[57] ABSTRACT

An exposure method for use with an exposure apparatus that includes a projection optical system for projecting a pattern of a first object onto a second object, a mark position detecting optical system having a detection zone at a predetermined position with respect to the projection optical system, for detecting a position of a mark of the second object, and a plurality of surface position detecting devices having different detection zones at different positions predetermined with respect to the projection optical system, for detecting a surface position of the second object. The mark is moved into the detection zone of the mark position detecting optical system, and the surface position of the second object is detected by using the surface position detecting devices. The surface position detecting devices respectively produce plural detection results. A deviation between the mark and the focal plane of the mark position detecting optical system is detected on the basis of (i) the results of the detection of the surface position and (ii) the positional relationship among the detection zone of the mark position detecting optical system and the detection zones of the surface position detecting devices.

13 Claims, 17 Drawing Sheets

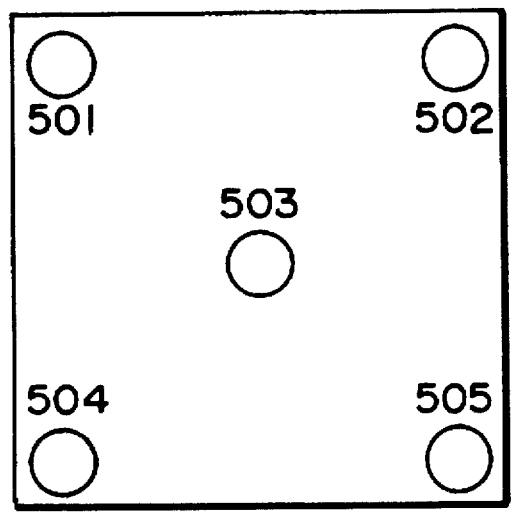
F I G. 5
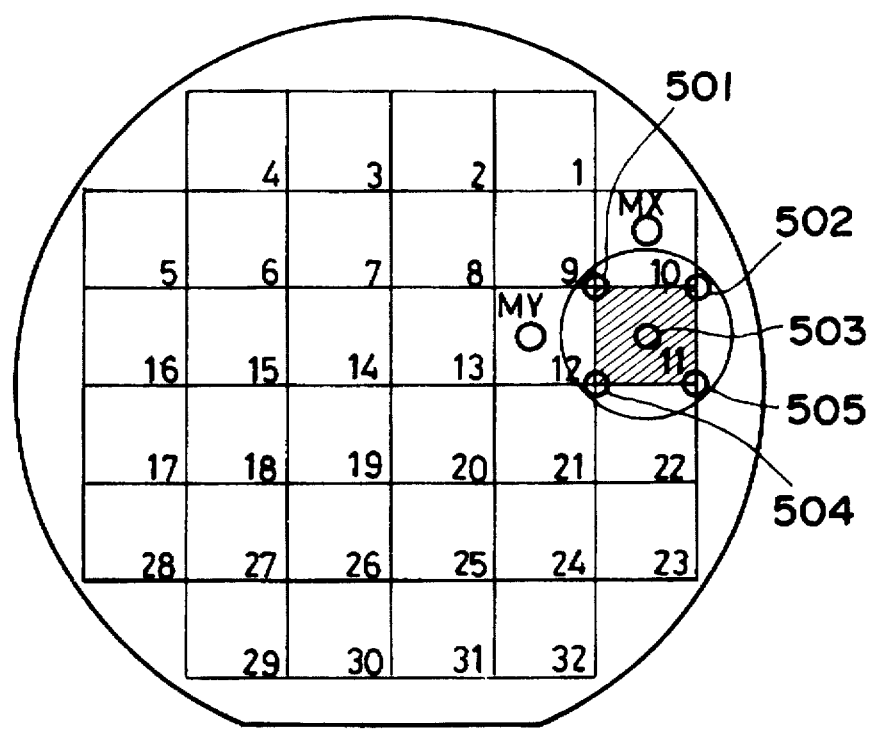
F I G. 6

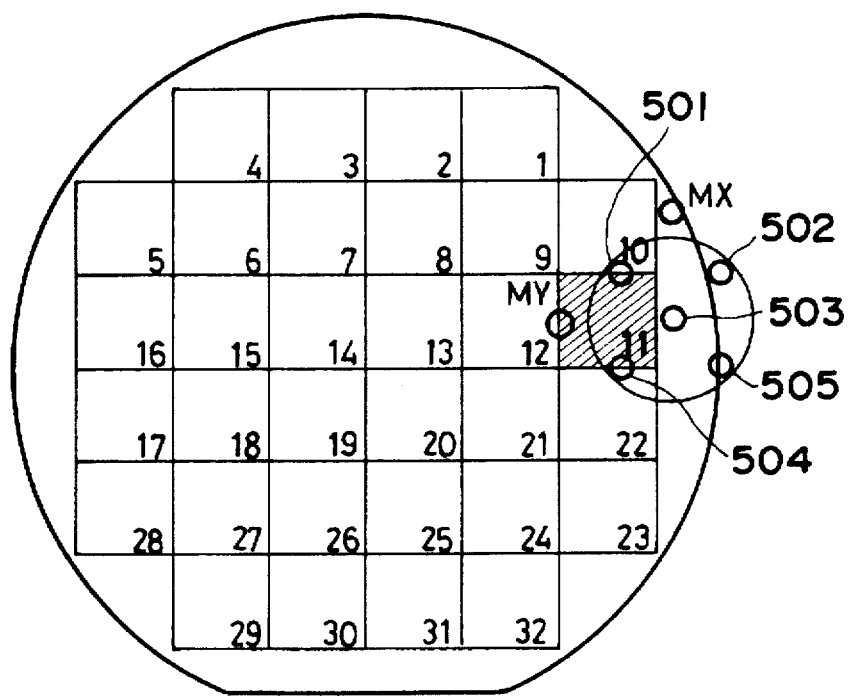
F I G. 7
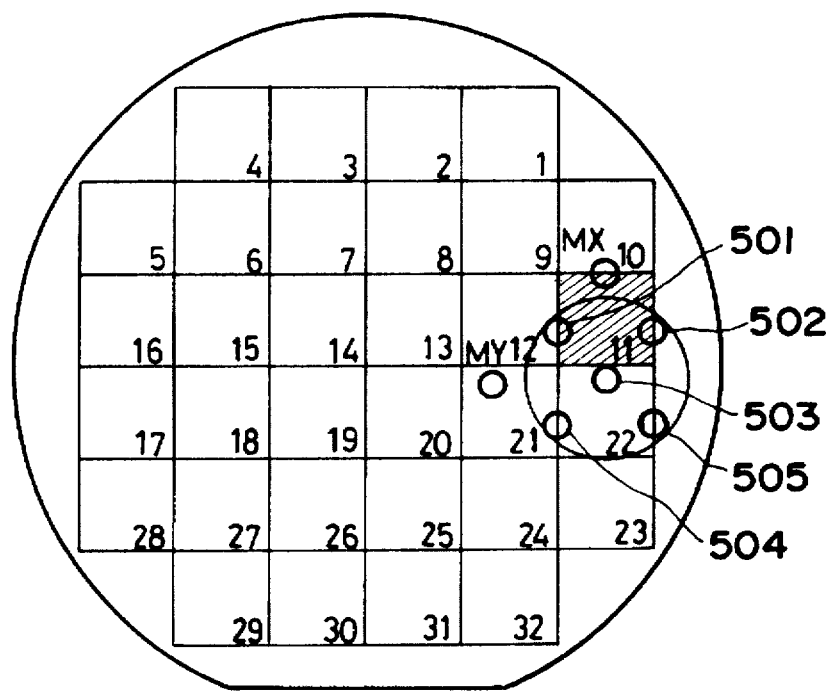
F I G. 8

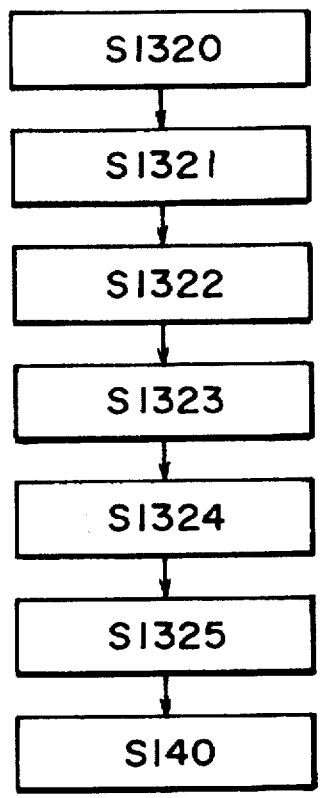
F I G. 14
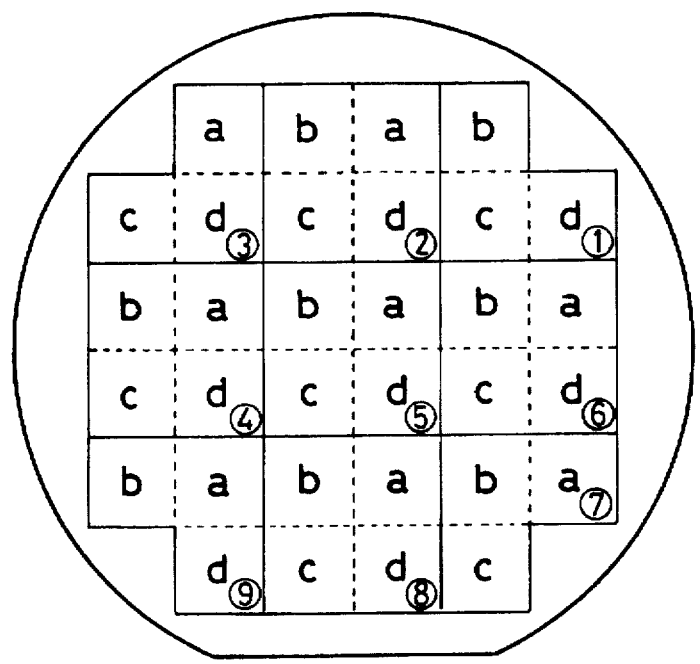
F I G. 15

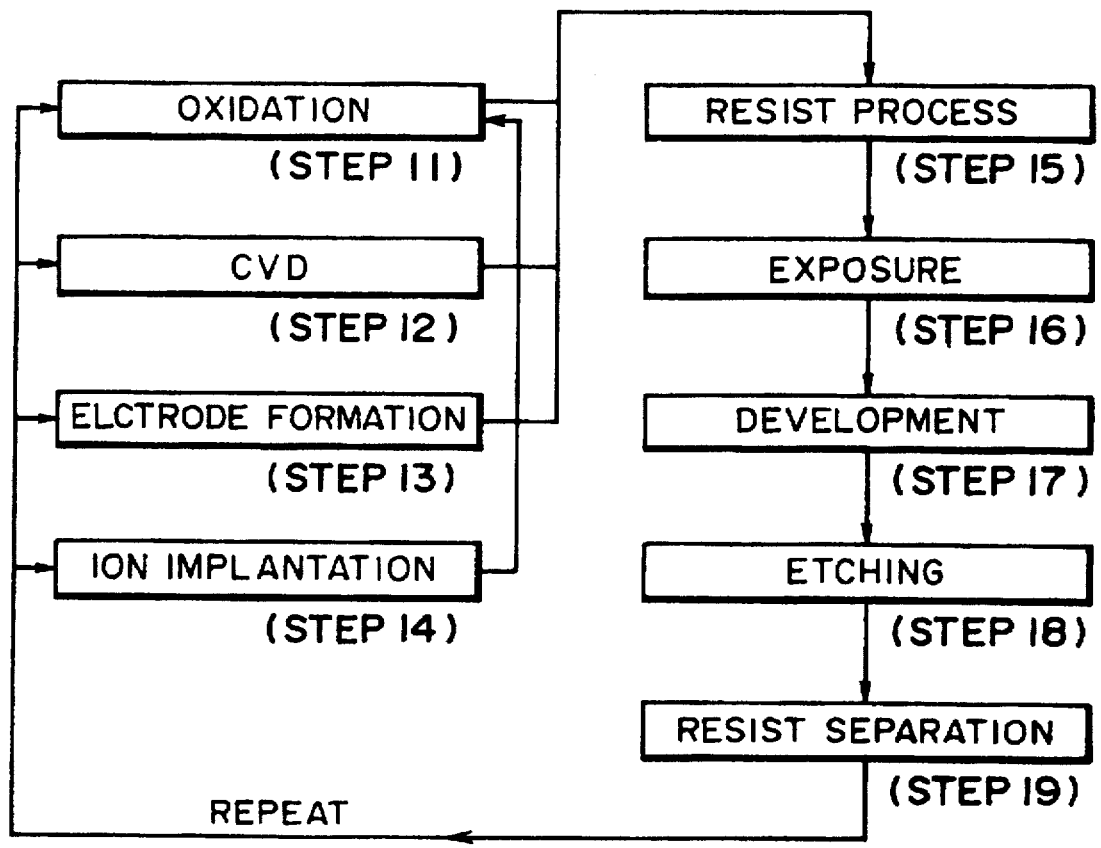
F I G. 22

1

EXPOSURE METHOD AND EXPOSURE APPARATUS USING THE SAME

FIELD OF THE INVENTION AND RELATED ART

This invention relates to an exposure method and an exposure apparatus using the same. More particularly, the invention is concerned with a projection exposure method and a projection exposure apparatus, such as a stepper, suitably usable for the manufacture of a semiconductor devices.

An example of wafer surface position detecting method is disclosed in Japanese Laid-Open Patent Application, Laid-Open No. 140418/1987. As shown in FIG. 1, information related to the height or level of a central portion of an exposure region is detected and adjusted by use of a surface position detecting optical system of a glazing incidence type.

In FIG. 1, denoted at 1 is a reduction projection lens having an optical axis AX. The optical axis AX is parallel to a Z direction shown in the drawing. Denoted at 3 is a stage for attracting a wafer 2 and for holding the same. Light from a light source 4 is transformed by an illumination lens into substantially parallel light, and it illuminates a mask 6 having a pinhole. Light passing the pinhole of the mask 6 goes through an imaging lens 7 and impinges on a deflecting mirror 8. After being deflected by this mirror, the light is projected on the wafer 2 surface obliquely. A pinhole image irradiates a central portion of the exposure region on the wafer 2, and it is reflected thereby.

Light reflected from the exposure region of the wafer 2 is deflected by a deflecting mirror 9 and, thereafter, it goes through a detection lens 10 and impinges on a position detecting element 11. The position detecting element 11 comprises a CCD or a position sensor, for example, and it serves to detect the position of incidence of the reflected light upon the light receiving surface thereof. A change in position of the wafer 2 in the optical axis AX direction of the projection lens 1, is detected as a displacement of the incidence position of the reflected light upon the position detecting element 11. Thus, the position of the wafer 2 surface at the central portion of the exposure region thereof, with respect to the optical axis AX direction is determined on the basis of an output signal from the position detecting element 11.

In conventional semiconductor device manufacturing apparatuses, during the alignment measuring operation in which an alignment mark or marks which are out of the central portion of an exposure region are detected through a mark detecting optical system, a focus sensor disposed at the central portion of the exposure region operates to detect the wafer surface position and the position of the wafer 2 in the optical axis AX direction is adjusted.

With the method described above, however, there is a possibility that, when a peripheral portion of a wafer is going to be exposed, the focus sensor becomes out of the range of the wafer or, due to the effect of warp of the wafer, for example, a portion of the exposure region is deviated from the focal plane of the reduction projection lens.

Also, there is a possibility that, when a wafer alignment mark or marks at a peripheral portion of a wafer are going to be measured, the focus sensor becomes out of the range of the wafer or, due to the effect of warp of the wafer, for example, the or an alignment mark is deviated from the focal plane of the mark detecting optical system.

Generally, a mark detecting optical system and a reduction projection lens have different focal point positions, and the alignment measurement position of an off-axis alignment system differs from the exposure position. It is, therefore, necessary to perform focus control prior to the alignment operation.

FIG. 2 shows a wafer on which a plurality of exposure regions (shots) are defined. While not shown in the drawing, each shot is provided with alignment marks formed in a peripheral portion thereof, for detection of the position of the shot. Reference numerals 100 each depicts an approximate position of a reduction projection lens, and reference numerals 101 each depicts a detection zone of a focus sensor for detecting the surface position of a central portion of the exposure region of the reduction projection lens. Reference characters MX each depicts a detection zone of a first mark detecting optical system for measuring an X-axis alignment mark which is in a fixed positional relationship with the reduction projection lens. Reference characters MY each depicts a detection zone of a second mark detecting optical system for measuring a Y-axis alignment mark which is in a fixed positional relationship with the reduction projection lens.

Illustrated with respect to a shot P0 in FIG. 2 is the positional relationship, at the exposure position, among the detection zone MX of the first mark detecting optical system, the detection zone MY of the second mark detecting optical system and the focus sensor detection zone 101. In another shot P1, however, when the Y-axis mark is going to be measured by using the second mark detecting optical system, the detection zone of the focus sensor is outside the wafer. Thus, with respect to the shot P1, focusing control is not attainable. Similarly, in another shot P2, when the X-axis mark is going to be measured by using the first mark detecting optical system, the position 101 of the detection zone of the focus sensor is outside the wafer. Thus, focus control is not attainable. Further, even if the detection zone 101 of the focus sensor is not outside the wafer, since the position of the detection zone of the focus sensor is separate from the position of the detection zone of the mark detecting optical system, an error may be involved in the measurement of the wafer surface level at the detection zone of the mark detecting optical system. If this occurs, in the alignment mark measurement, there is produced a large deviation between the focal plane of the mark detecting optical system and the alignment mark, which degrades the precision of the mark position detection.

SUMMARY OF THE INVENTION

It is accordingly an object of the present invention to provide an improved projection exposure method.

It is another object of the present invention to provide an improved projection exposure apparatus.

It is a further object of the present invention to provide an improved projection exposure method and/or apparatus: in which, with respect to a peripheral portion of a wafer, a deviation between an exposure region and a focal plane of a reduction projection lens can be reduced; in which, in a case when the position of a detection zone of a focus sensor differs from the position of a detection zone of a mark detecting optical system, even with respect to a peripheral portion of a wafer for which focus sensor measurement is not attainable, a deviation between the focal plane of the mark detecting optical system and the alignment mark can be reduced; and in which a reticle and a wafer can be aligned with each other with good precision such that a pattern of the reticle can be transferred and printed on the wafer satisfactorily.

In accordance with an aspect of the present invention, there is provided an exposure method in an exposure apparatus which includes a projection optical system for projecting a pattern of a first object onto a second object, a mark position detecting optical system having a detection zone at a predetermined position with respect to the projection optical system, for detecting a position of a mark formed on the second object, and a plurality of surface position detecting devices having different detection zones at different positions predetermined with respect to the projection optical system, for detecting a surface position of the second object, said method comprising the steps of: placing the mark within the detection zone of the mark position detecting optical system; detecting the surface position of the second object by using the surface position detecting devices, wherein plural detection results are produced by the surface position detecting devices, respectively; and determining, for detection of the position of the mark through the mark position detecting optical system, a deviation between the mark and a focal plane of the mark position detecting optical system on the basis of (i) the results of said detection of the surface position and (ii) the positional relationship among the detection zone of the mark position detecting optical system and the detection zones of the surface position detecting devices.

In one preferred form of this aspect of the present invention, said determining step includes selecting at least one of the results of the detection in said detecting step, on the basis of a predetected position of the mark of the second object.

In another preferred form of this aspect of the present invention, said determining step includes weighting the results in said detecting step, in accordance with a distance between the detection zone of the mark position detecting optical system and the detection zones of the surface position detecting devices, and calculating the deviation.

In a further preferred form of this aspect of the present invention, said determining step includes calculating an approximate plane of the second object on the basis of the results in said detecting step, to determine the deviation.

In accordance with another aspect of the present invention, there is provided an exposure apparatus, comprising: a projection optical system for projecting a pattern of a first object onto a second object; a mark position detecting optical system having a detection zone at a predetermined position with respect to said projection optical system, for detecting a position of a mark on the second object; a plurality of surface position detecting means having different detection zones at different positions being predetermined with respect to said projection optical system, for detecting a surface position of the second object; driving means for moving the second object in a direction perpendicular to an optical axis of said projection optical system; and control means, wherein said control means serves to actuate said driving means so as to place the mark within the detection zone of said mark position detecting optical system, wherein said control means serves to detect the surface position of the second object with the use of said plural surface position detecting means whereby a plurality of detection results are produced, and wherein, for detection of the position of the mark through said mark position detecting optical system, said control means serves to determine a deviation between the mark and a focal plane of the mark detecting optical system on the basis of (i) said results of the surface position detection and (ii) the positional relationship among the detection zone of said mark position detecting optical system and the detection zones of said plural surface position detecting means.

In one preferred form of this aspect of the present invention, said control means selects at least one of said detection results on the basis of a predetected position of the mark of the second object.

In another preferred form of this aspect of the present invention, said control means serves to weight said detection results in accordance with a distance between the detection zone of said mark position detecting optical system and the detection zones of said plural surface position detecting means, and to calculate the deviation.

In a further preferred form of this aspect of the present invention, said control means serves to calculate an approximate plane of the second object on the basis of said detection results to determine the deviation.

In accordance with a further aspect of the present invention, there is provided an exposure method in an exposure apparatus including an exposure system for sequentially moving a first object having arrayed exposure zones with the same pattern structure formed thereon and for printing a pattern of a second object on the exposure zones of the first object sequentially fed to an exposure station, and surface position detecting means having different detection zones being predetermined with respect to the exposure system, for detecting the surface position of the first object at different locations, said method comprising: an error detecting step wherein, when an error in the detection of the surface position of the first object through said surface position detecting means, which error is related to a predetermined one of the exposure zones and is dependent upon the pattern structure, differs from a similar error related to another exposure zone, an error in the detection of the surface position as the predetermined exposure zone is at a predetermined position adjacent to the exposure station and being dependent upon the pattern structure is detected; a surface position detecting step for moving the predetermined exposure zone to the predetermined position and for detecting, at different locations, the surface position of the first object through the surface position detecting means; a correcting step for correcting a measurement value obtained in said surface position detecting step, on the basis of the detected error; and an adjusting step for adjusting, before the pattern of the second object is printed on the predetermined exposure zone, being moved from the predetermined position to the exposure station, the attitude of the first object on the basis of the corrected measurement value.

In one preferred form of this aspect of the present invention, the method further comprises a second surface position detecting step for moving the predetermined exposure zone to the exposure station and for detecting, at different locations, the surface position of the first object by the use of the surface position detecting means, and a second adjusting step for adjusting the position of the first object with respect to a direction along the spacing between the first and second objects, on the basis of at least one of the results of detection of the the surface position, obtained in said second surface position detecting step.

In accordance with a still further aspect of the present invention, there is provided an exposure apparatus for sequentially moving a first object having arrayed exposure zones with the same pattern structure formed thereon and for printing a pattern of a second object on the exposure zones of the first object sequentially fed to an exposure station through an exposure system, said apparatus comprising: first driving means for moving the first object; second driving means for changing the attitude of the first object; surface position detecting means having different detection zones being predetermined with respect to said exposure system, for detecting the surface position of the first object at different locations; and control means wherein, when an error in the detection of the surface position of the first object through said surface position detecting means, which error is related to a predetermined one of the exposure zones and is dependent upon the pattern structure, differs from a similar error related to another exposure zone, said control means serves to detect an error in the detection of the surface position as the predetermined exposure zone is at a predetermined position adjacent to the exposure station and being dependent upon the pattern structure, wherein said control means serves to move the predetermined exposure zone to the predetermined position and to detect, at different locations, the surface position of the first object through said surface position detecting means, wherein said control means serves to correct a measurement value of the surface position on the basis of the detected error, and wherein said control means serves to adjust, through said second driving means and before the pattern of the second object is printed on the predetermined exposure zone, being moved from the predetermined position to the exposure station, the attitude of the first object on the basis of the corrected measurement value.

In one preferred form of this aspect of the present invention, said control means serves to move the predetermined exposure zone to the exposure station and then to detect, at different locations, the surface position of the first object by use of said surface position detecting means, and wherein said control means serves to adjust the position of the first object with respect to a direction along the spacing between the first and second objects, on the basis of at least one of the results of the detection of the surface position.

In accordance with a yet further aspect of the present invention, there is provided a device manufacturing method for manufacturing devices by use of an exposure apparatus including an exposure system for sequentially moving a resist-coated wafer having arrayed exposure zones with the same pattern structure formed thereon and for printing a pattern of a mask on the exposure zones of the wafer sequentially fed to an exposure station, and surface position detecting means having different detection zones being predetermined with respect to the exposure system, for detecting the surface position of the wafer at different locations, said method comprising: an error detecting step wherein, when an error in the detection of the surface position of the wafer through the surface position detecting means, which error is related to a predetermined one of the exposure zones and is dependent upon the pattern structure, differs from a similar error related to another exposure zone, an error in the detection of the surface position as the predetermined exposure zone is at a predetermined position adjacent to the exposure station and being dependent upon the pattern structure is detected; a surface position detecting step for moving the predetermined exposure zone to the predetermined position and for detecting, at different locations, the surface position of the wafer through the surface position detecting means; a correcting step for correcting a measurement value obtained in said surface position detecting step, on the basis of the detected error; and an adjusting step for adjusting, before the pattern of the mask is printed on the predetermined exposure zone, being moved from the predetermined position to the exposure station, the attitude of the wafer on the basis of the corrected measurement value.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a schematic view for explaining the positional relationship among an exposure zone and measurement points, in the surface position detection through a surface position detecting optical system.

FIG. 6 is a schematic view for explaining the positional relationship among a detection zone of a mark detecting optical system for wafer mark measurement and five measurement points on a wafer, for measurement of the surface position and the X-Y stage position in the exposure process.

FIG. 7 is a schematic view for explaining the positional relationship among a detection zone of a mark detecting optical system for wafer mark measurement and five measurement points on a wafer for measurement of the surface position and the X-Y stage position, during the Y-axis deviation measurement.

FIG. 8 is a schematic view for explaining the positional relationship among a detection zone of a mark detecting optical system for wafer mark measurement and five measurement points on a wafer for measurement of the surface position and the X-Y stage position, during the X-axis deviation measurement.

FIG. 14 is a flow chart for explaining the flow of step S1320 to step S140.

FIG. 15 is a schematic view for explaining a shot layout wherein patterns of the same structure are formed in one shot.

FIG. 22 is a flow chart of a wafer process.

DESCRIPTION OF THE PREFERRED EMBODIMENTS

[First Embodiment]

A first embodiment of the present invention will now be described in detail.

Figure 1:
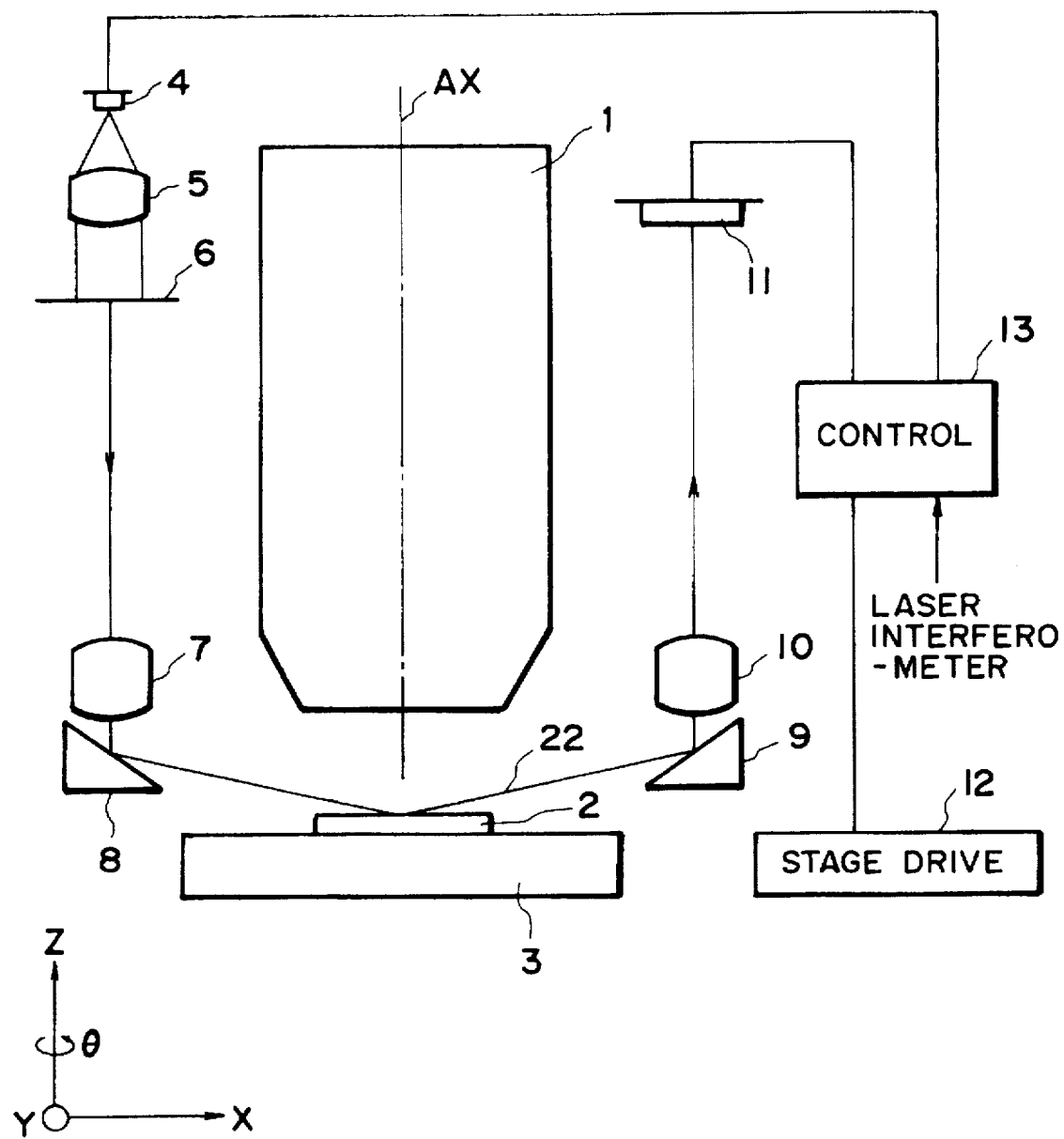
FIG. 1 is a schematic view of a portion of a reduction projection exposure apparatus based on a known wafer surface position detecting method.
Figure 2:
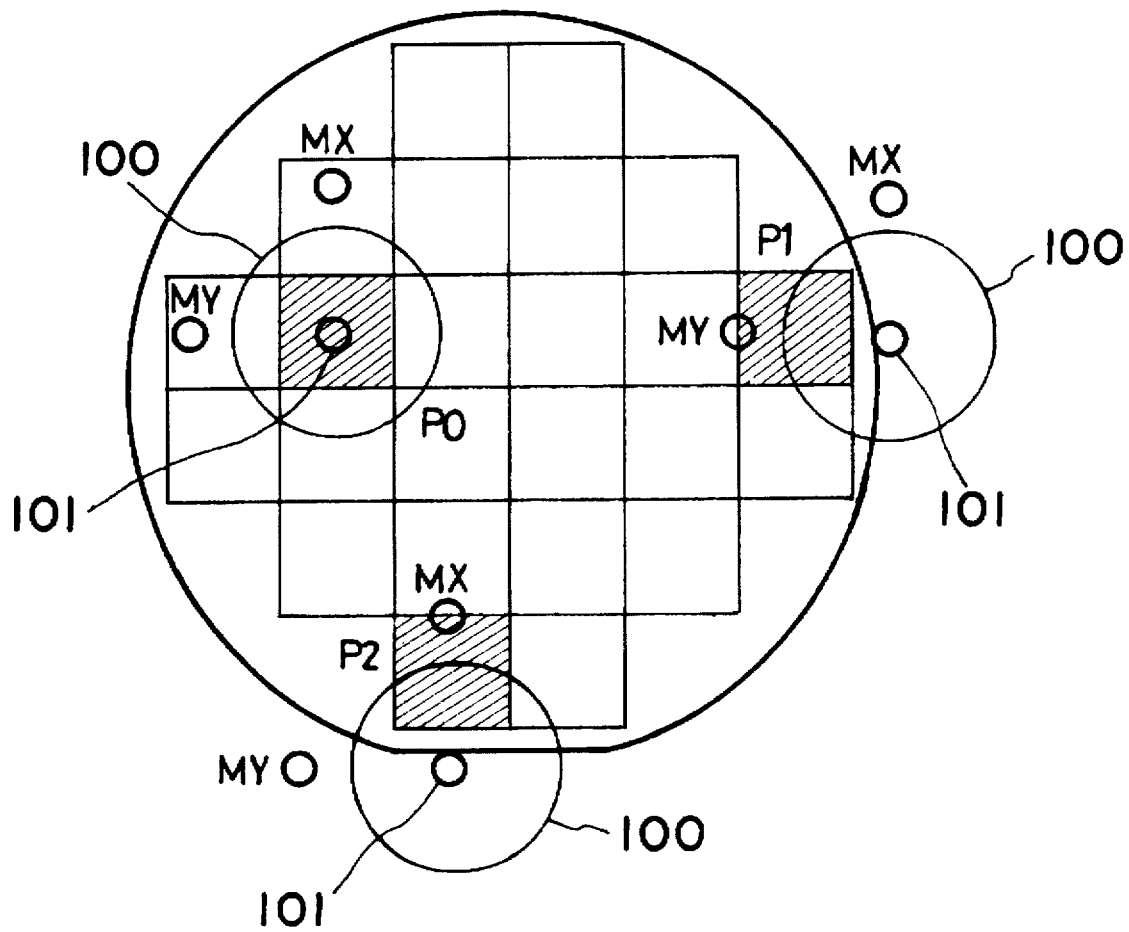
FIG. 2 is a schematic view for explaining the positional relationship between a detection zone of the wafer surface position detection and a detection zone of a mark detecting optical system, in the wafer mark measurement.
Figure 3:
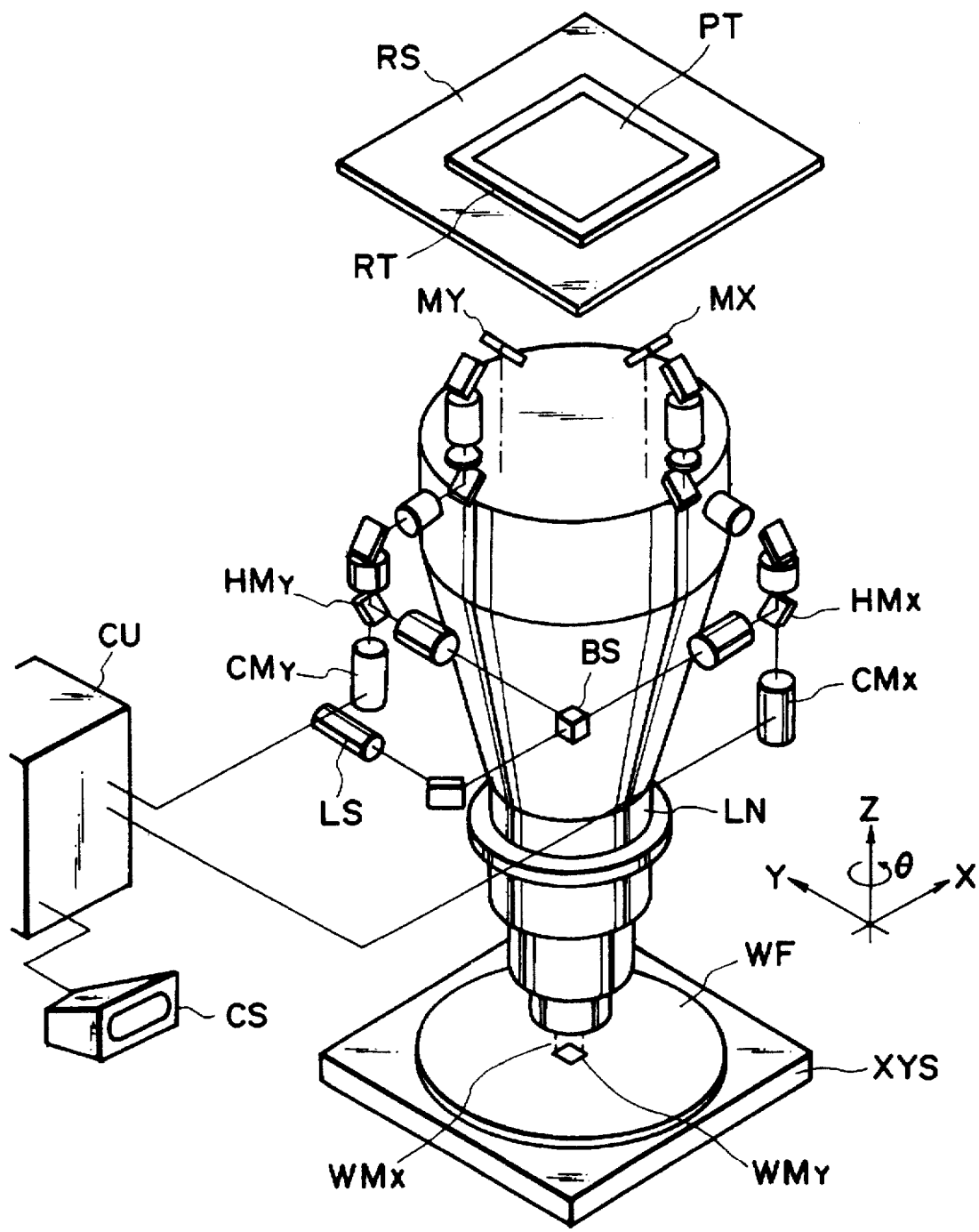
FIG. 3 is a perspective view of a step-and-repeat exposure apparatus according to an embodiment of the present invention.

FIG. 3 shows a step-and-repeat type exposure apparatus, arranged to measure the position of each shot on a wafer WF. In this drawing, laser light from a light source LS is bisected into two optical paths by a beam splitter BS, and the split laser beams are directed to a projection lens LN via objective mirrors MX and MY, respectively, disposed between a reticle stage RS and the projection lens LN. Then, the laser beams illuminate wafer marks WMx and WMy formed on the wafer WF. Image pickup device CMx takes an image of the wafer mark WMx, through the projection lens LN, the objective mirror Mx and a half mirror HMx. Image pickup device CMy takes an image of the wafer mark WMy, through the projection lens LN, the objective mirror My and a half mirror HMy. In this example, the optical arrangement from the wafer mark to the image pickup device, including the projection lens, constitutes a mark detecting optical system. Any positional deviation of the wafer mark WMx or WMy is detected with respect to the center of the image pickup view field of the image pickup device CMx or CMy.

Figure 4:
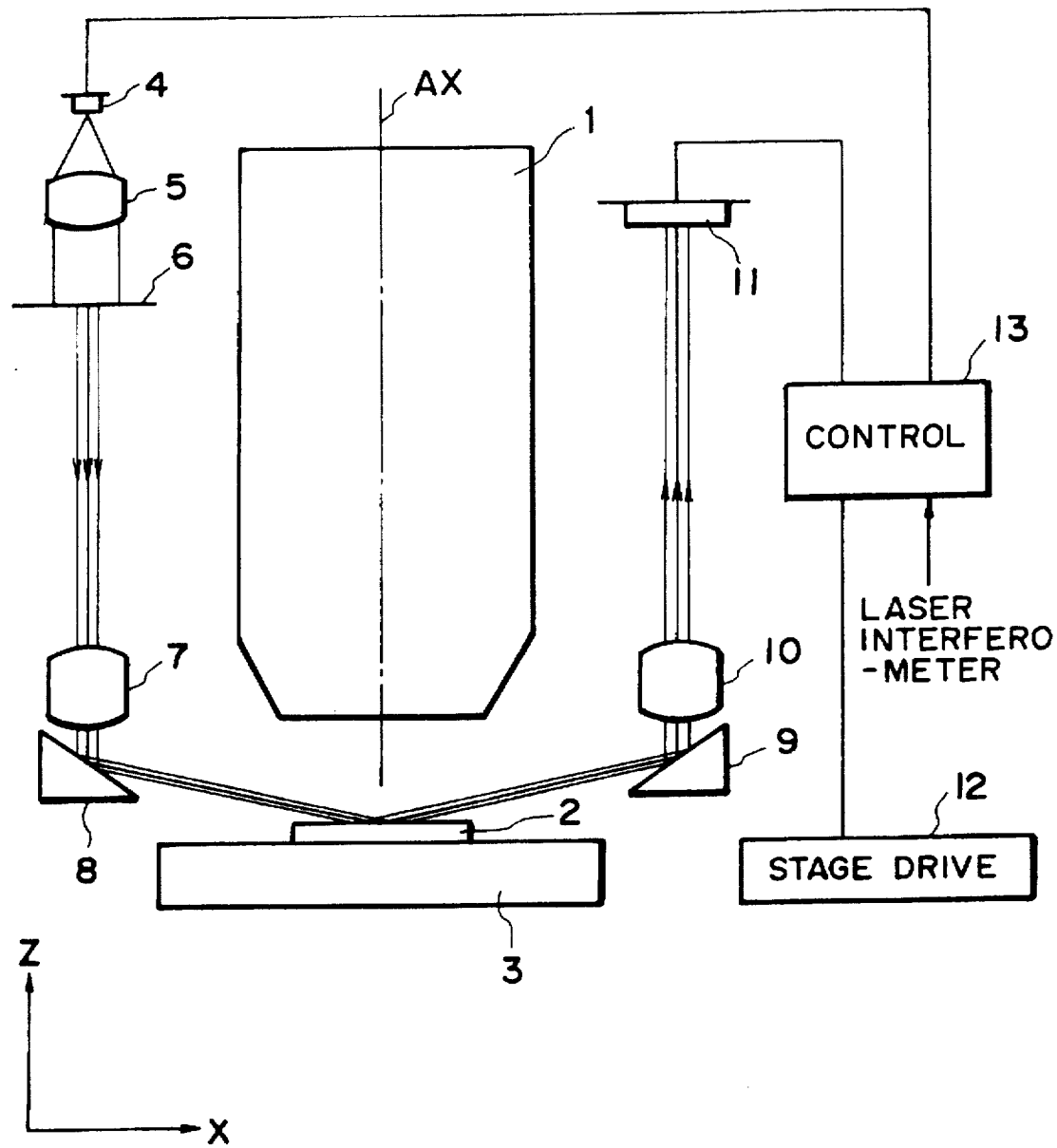
FIG. 4 is a schematic view of a reduction projection exposure apparatus which is based on an alignment system according to the present invention.

FIG. 4 is a schematic view of a portion of a reduction projection exposure apparatus having a surface position detecting device. The optical axis is denoted by AX in the drawing. The optical axis AX is parallel to the Z-axis direction as illustrated. Reference numerals 4–11 denote components of a detection optical system for detecting the surface position and any tilt of a wafer 2. Denoted at 4 is a high luminance light source such as a light emitting diode or a semiconductor laser, for example. Denoted at 5 is an illumination lens. Light emitted by the light source 4 is transformed by the illumination lens into parallel light, and it illuminates a mask 6 having a plurality of pinholes. Light beams passing the pinholes of the mask 6 go through an imaging lens 7, and they are projected on a deflecting mirror 8. After being deflected by the mirror 8, the light beams are projected on the wafer 2 surface. The plural light beams irradiate five places 501–505 (FIG. 5), respectively, including a central portion of an exposure zone of the wafer, as the wafer is at such a position with respect to the reduction projection lens at which the wafer is going to be exposed. The plural light beams are reflected by these places, respectively. Here, the surface position detecting device is in a fixed positional relationship with the reduction projection lens. Therefore, the positions of the detection zones defined at the five places, respectively, for the surface position detection are at predetermined positions with respect to the exposure region defined by the projection lens.

In this embodiment, the mask 6 is formed with five pinholes, and the position measurement is performed at five measurement points including the central portion. However, the invention is not limited to this example. In the alignment system of the present invention, the surface position detecting device may not be of an optical type. It may be of air type, provided that similar detection zones are defined at similar places.

The light beams reflected at the measurement points on the wafer 2, respectively, are then deflected by a deflecting mirror 9 and, after passing through a detection lens 10, they are projected on a two-dimensional (area) position detecting element 11. The two-dimensional position detecting element 11 comprises a CCD means, for example, and it is operable to detect the positions of incidence of the plural light beams upon the light receiving surface of the element 11, independently of each other.

A change in the position of the wafer 2, with respect to the direction of the optical axis AX of the projection lens 1, is detected as a shift of the position of incidence of each light beam upon the two-dimensional position detecting element 11. Thus, the position of the wafer surface with respect to the optical axis AX direction, at each of the five measurement points on the wafer, is detectable on the basis of the output signal from the two-dimensional position detecting element 11.

Displacement of a wafer stage 3 in the X-axis direction or Y-axis direction is measured through a laser interferometer. A signal which represents the amount of displacement of the wafer stage 3 is applied by the laser interferometer to a control device 13 through a signal line. The displacement of the wafer stage 3 is controlled by a stage driving means 12. The stage driving means 12 receives a control signal from the control device 13 via a signal line and, in response to this signal, the stage driving means drives the wafer stage 3. The stage driving means 12 includes a first driving means and a second driving means. The first driving means serves to adjust the position (x, y) and rotation (θ) of the wafer 2 within a plane perpendicular to the optical axis AX. The second driving means serves to adjust the position and tilt (φxy) of the wafer 2 with respect to the optical axis AX direction.

The control device 13 functions to detect the position of the wafer 2 surface, on the basis of the output signal (surface position data) supplied from the two-dimensional position detecting element 11. Then, on the basis of the result of the detection, it applies an appropriate control signal to the stage driving means 12. In response to this control signal, the second driving means of the stage driving means 12 operates to adjust the position and/or tilt of the wafer 2 with respect to the optical axis AX direction.

FIG. 6 illustrates the positional relationship among the X-Y stage position, the five measurement points for the surface position detection and the detection zones Mx and My of the mark detecting optical system, when a particular shot (No. 11) is going to be exposed.

FIG. 7 illustrates the positional relationship among the stage position, the five measurement points for the surface position measurement and the detection zones Mx and My of the mark position detecting optical system, when, at the particular shot (No. 11), the wafer mark WMy is going to be measured.

FIG. 8 illustrates the positional relationship among the stage position, the five measurement points for the surface position measurement and the detection zones Mx and My of the mark detecting optical system, when, at the particular shot (No. 11), the wafer mark WMx is going to be measured.

Referring to the flow chart of FIG. 9, the processes in this embodiment, up to the exposure process, will be explained.

Step S01: The X-Y stage is moved to a position at which the wafer mark WMy, for deviation measurement in the Y direction, can be detected with the detection zone My.

Step S02: Of the five measurement points shown in FIG. 7 for the surface position measurement, such a measurement point or points which are at a shortest distance from the detection zone My and which are other than the measurement point or points as predicted as being off the wafer in dependence upon the position of the wafer mark, are selected. Thus, in this example, the measurement points 501 and 504 are selected. Of course, only the measurement point 501 may be selected. Namely, in step S02, at least one measurement point is selected.

Step S03: The surface position measurement is performed with respect to the measurement point or points selected in step S02. Then, by using the second driving means of the stage driving means 12, the position of the wafer 2 with respect to the optical axis AX direction is corrected.

Step S04: The wafer mark WMy is measured with the detection zone My.

Step S05: The X-Y stage is moved to a position at which the wafer mark WMx, for deviation measurement in the X direction, can be measured with the detection zone Mx.

Step S06: The measurement points 501 and 102 which are at a shortest distance to the detection zone Mx are selected, although in FIG. 8, all the surface position measurement points are on the wafer.

Step S07: The surface position measurement is performed with the measurement point or points as selected at step S06. If there are plural effective measurement points used, an average of the results may be taken or, alternatively, weighting may be made on the basis of the distance between the detection zone and each measurement point so as to average the results, and an average obtained may be taken. Then, by using the second driving means of the stage driving means 12, the position of the wafer 2 with respect to the optical axis AX direction is corrected. Step S08: Measurement of the wafer mark WMx is performed with the detection zone Mx.

Step S09: The procedure of steps S01–S08 is repeated until the measurement to all sample shots, which are predetermined for the alignment measurement, is completed.

Step S10: From the measured values in relation to the alignment measurement sample shots, the amount of correction to be made by the first driving means, for moving the wafer along a plane perpendicular to the optical axis, is calculated. When the stage is to be moved subsequently by using the first driving means, the stage drive is performed while correcting the coordinate position of the stage in accordance with the thus calculated correction amount.

Now, the procedure of determining the correction amount for the focus measurement (steps S11 and S12) as well as the procedure of correcting the position and tilt of the wafer with respect to the optical axis direction (steps S13 and S14) for the exposure process and through the second driving means, will be explained in detail.

Figure 10:
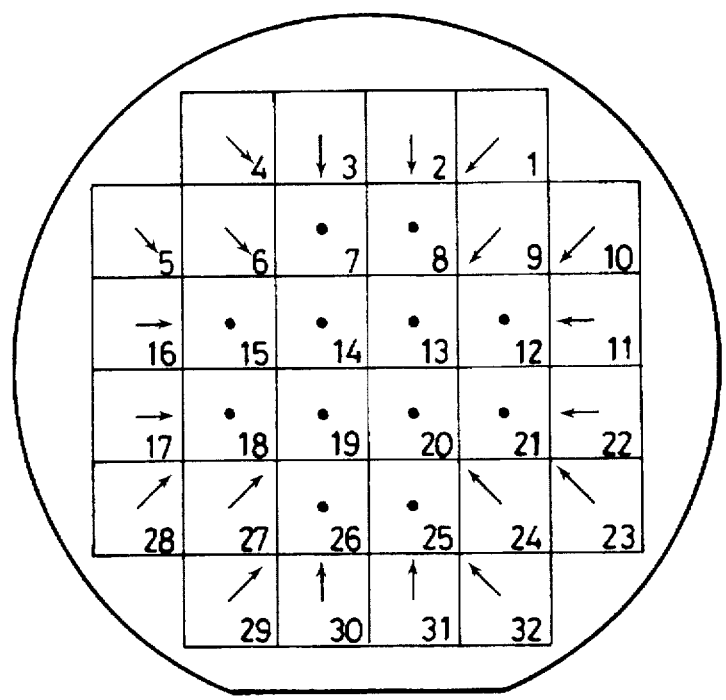
FIG. 10 is a schematic view for explaining displacements in preparative measurement points and an exposure position.

FIG. 10 illustrates, with respect to every shot on the wafer, the amount of displacement between the position to be taken just at the time of the exposure process and the preparative measurement position to be taken for preparative measurement for measuring, just before the exposure process, the surface position of the wafer with a plurality of focus sensors. Eight directions, as denoted by arrows in the drawing, depict that the center position of the detection zones at five places of the focus sensors is shifted by the stage movement. Dots in the drawing depict that the position for the exposure and the position for the preparative measurement coincide with each other.

As regards the sites indicated by arrows, for example, the shots Nos. 1, 3, 5, 17, 29, 31, 23 and 11, when one or more of the detection zones of the focus sensors a t the exposure position in the peripheral portion of the wafer are positioned off the wafer shot layout, the wafer is displaced toward the center of the wafer so that all the detection zones of the focus sensors are placed within the layout. Each arrow depicts the position thus displaced. In this embodiment, the movement in the same direction is done through the same amount.

As an alternative, in a case when one or more of the detection zones of the focus sensors at the exposure position are at such a position (e.g., on the boundary (scribe line) between adjacent pattern areas) at which a surface position measurement error quite larger than a similar error to be produced in relation to the pattern area is predicted, due to the presence of a large step (level difference) with the pattern area, for example, the wafer may be moved so that all the detection zones of the focus sensors are placed within the pattern areas.

The amount of displacement is calculated automatically in a console CS (FIG. 3) on the basis of the shot layout information and the detection zones at five places of the focus sensors.

In FIG. 3, denoted at CU is a control unit for controlling the stepper as a whole. Denoted at CS is the console for inputting necessary information such as alignment data or exposure data, for example, into the control unit CU.

Figure 11:
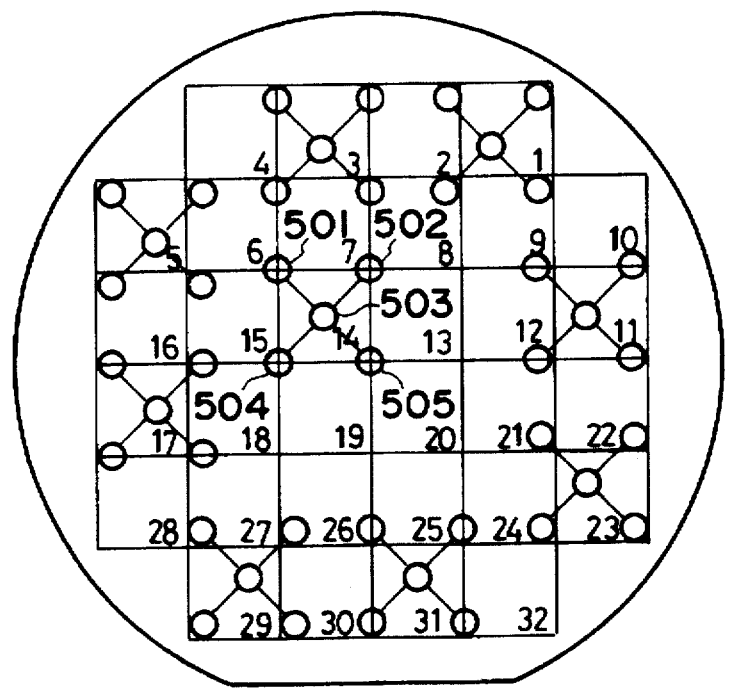
FIG. 11 is a schematic view for explaining a shot layout and detection zones of focus sensor means.

FIG. 11 illustrates, as representative, the positions of the detection zones at five places of the focus sensors as assumed as a result of movement illustrated in FIG. 10.

Figure 12:
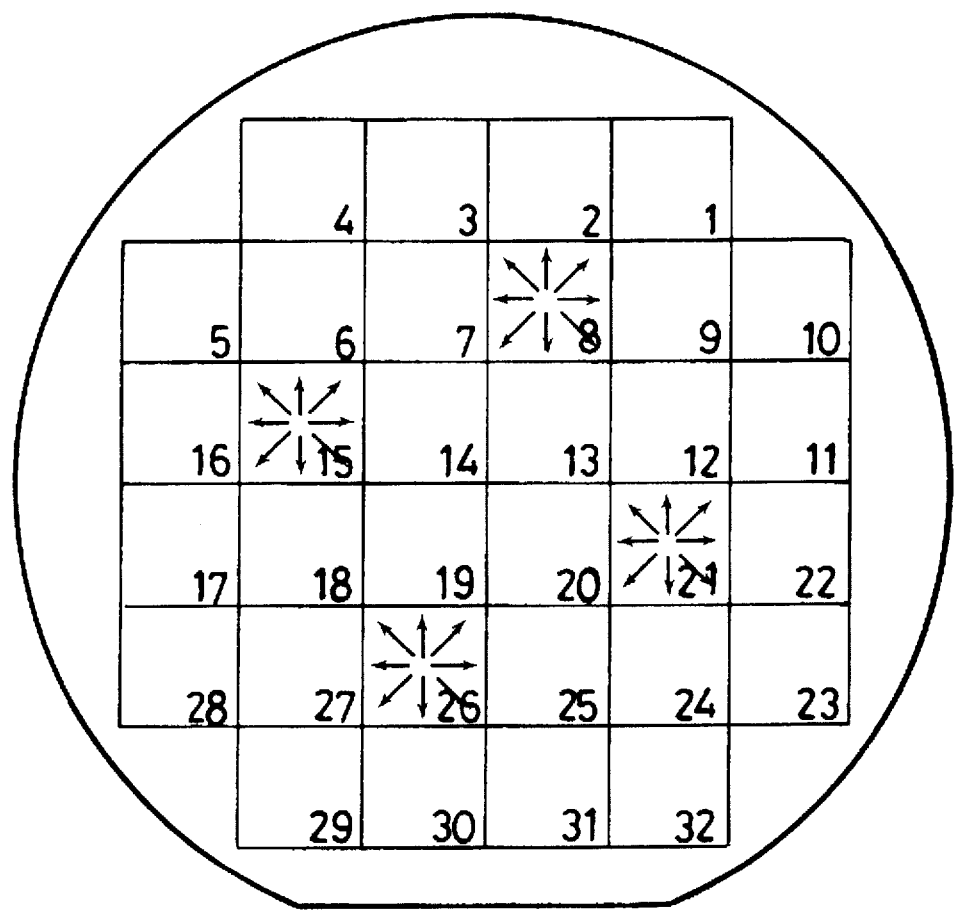
FIG. 12 is a schematic view for explaining sample shots for measurement.

FIG. 12 illustrates, by using arrows and dots similar to those of FIG. 10, measurement sample shots (Nos. 8, 15, 26 and 21) for calculation of a focus offset correction amount and the displaced positions of the focus sensors at the time of sample shot measurement. The number of movement directions is the same as of FIG. 10. The amount of movement if it is in the same direction as that the movement, in FIG. 10, is the same as that of the movement in FIG. 10.

These sample shots are set automatically once the number of sample shots is set in the console CS (FIG. 3) so that, with respect to nine points (displaced positions) including one at which the exposure position and the preparative measurement position coincide with each other, all the detection zones at five places of the focus sensors are placed within the layout.

Generally, an alignment mark has a larger line width as compared with a circuit pattern formed on the wafer through a reduction projection lens. In other words, the depth of focus required for the reduction projection lens for forming a circuit pattern should be larger than the depth of focus required for a mark detecting optical system for observation of an alignment mark.

Thus, in order to produce a satisfactory circuit pattern over the whole surface of the exposure region, particular attention should be paid to a difference in the focus measured value at the position of the focus sensor detection zone, attributable to pattern surface irregularities formed on the wafer surface.

Japanese Laid-Open Patent Application, Laid-Open No. 102518/1990 discloses a method of correcting a focus sensor measurement error on the basis of the periodicity of patterns transferred to a wafer and having the same structure.

However, even with this method, on an occasion when, in a peripheral shot of a wafer, the detection zone of the focus sensor is placed at the boundary between a pattern region on the wafer and an outside circumferential region having no pattern, there is no pattern periodicity any more. Thus, the amount of correction may not be determined. For such wafer shots which are at the peripheral portion of the wafer, an error may be produced in the measurement point, of the plural measurement points of the focus sensors, which point is at the boundary. Such an error degrades the measurement precision to wafer surface tilt, and a sufficient margin to the depth of focus is not available. Further, even if only those of the measurement points of the focus sensors which are placed within the pattern region on the wafer are used, in the peripheral portion of the wafer, the measurement precision to wafer surface tilt may be degraded due to the effect of warp of the wafer surface. Also, there is a possibility that only two or fewer measurement points are available such that correction of surface tilt could not be performed. In any case, with regard to a shot at the peripheral portion of the wafer, these is a possibility of a reduced or an insufficient margin to the depth of focus.

Referring now to the flow chart of FIG. 13, how to correct the wafer position through the second driving means, for focusing and leveling, will be explained in detail.

Figure 9:
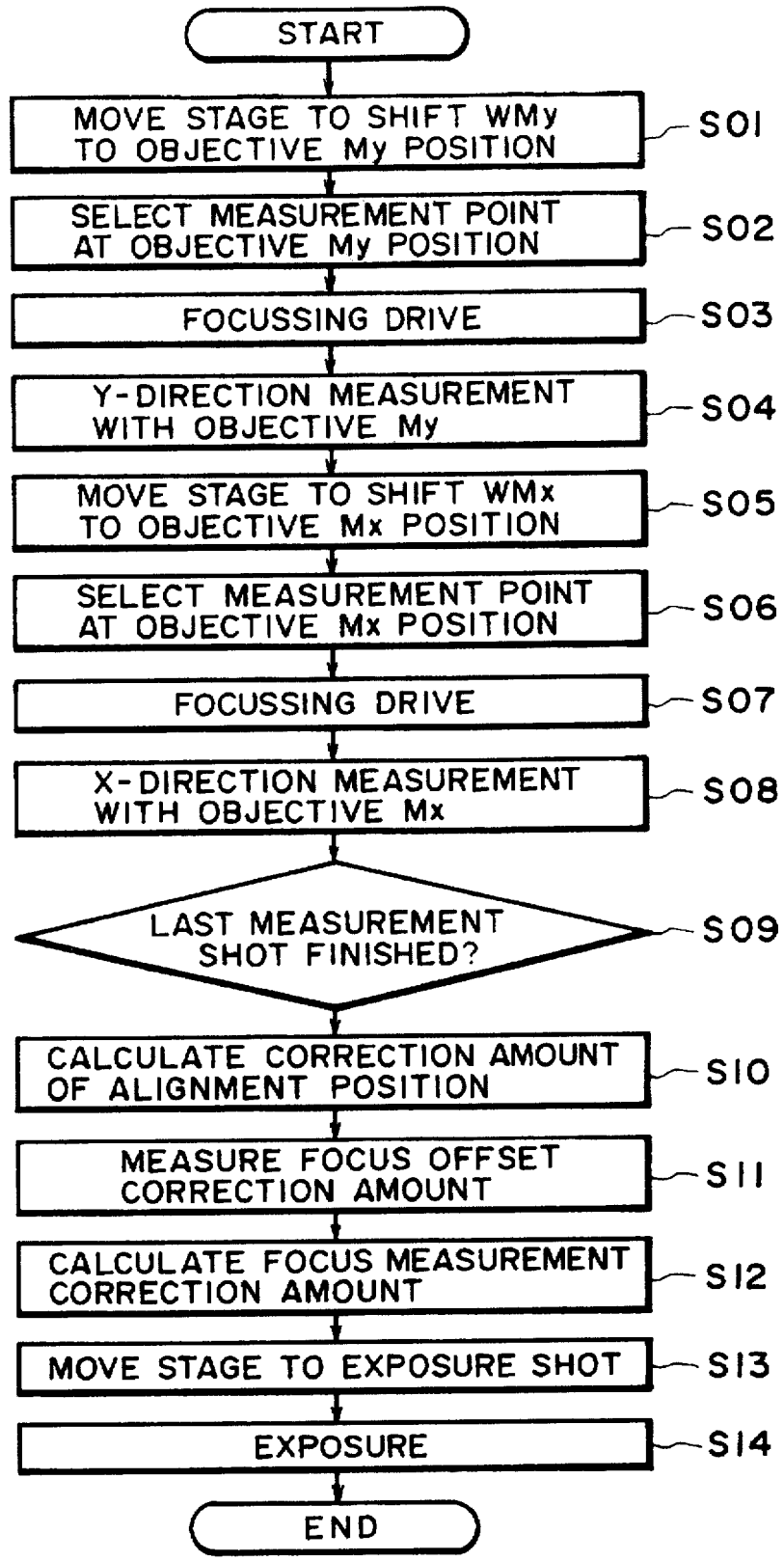
FIG. 9 is a flow chart for explaining an exposure method according to a first embodiment of the present invention.
Figure 13:
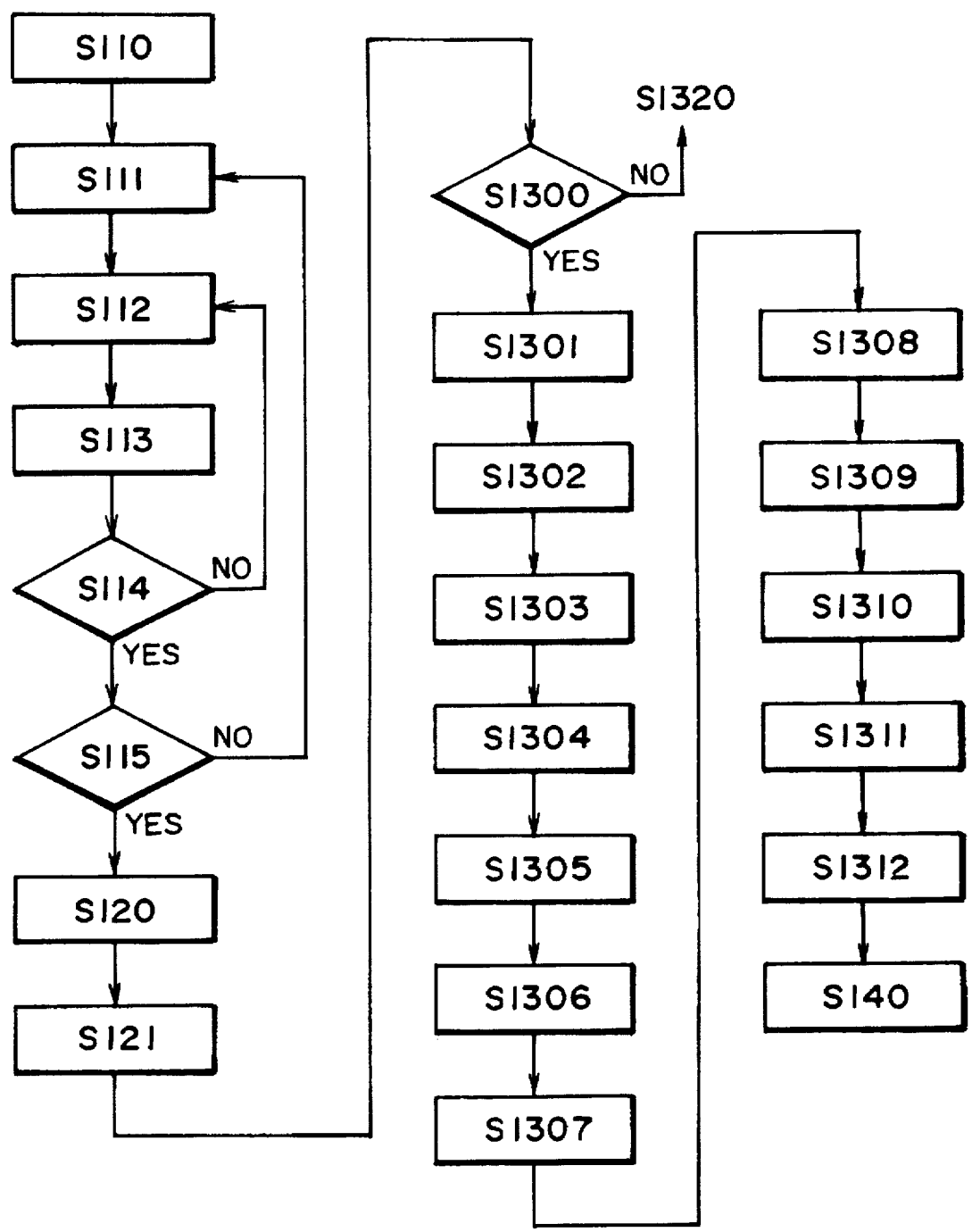
FIG. 13 is a flow chart for explaining details of step S11 to step S14 in FIG. 9.

FIG. 13 is a flow chart for explaining details of the procedure to be made at steps S11–S14 in FIG. 9.

The concept of measuring and determining the focus offset correction amount in the procedure of steps S11 and S12 shown in FIG. 9 may be stated as the result of extending what is disclosed in Japanese Laid-Open Patent Application, Laid-Open No. 102518/1990 so as to perform the procedure with respect to nine points in the shot of FIG. 12.

Steps S110–S115 in FIG. 13 are the procedures to be made in step S11 of FIG. 9.

Step S110: By using the second driving means of the stage, the attitude of the wafer surface is held fixed, with regard to tilt and position with respect to the optical axis AX direction.

Step S111: The stage is moved to the sample shot position of sample shot No. 8, for example, shown in FIG. 12.

Step S112: Then, the stage is moved to the position depicted by a dot (or arrow) of sample shot No. 8, for example, shown in FIG. 12. Namely, the stage is moved to a predetermined focus sensor position.

Step S113: At the position of the sample shot No. 8, for example, shown in FIG. 12, the wafer position with respect to the optical axis AX direction is measured, this being done with respect to the five measurement points of the focus sensors.

Step S114: The procedure of steps S112–S113 is repeated until measurements at the predetermined nine points shown in FIG. 12 are completed. Namely, a discrimination is made whether measurement at a predetermined last focus sensor position is completed. If not, the sequence goes back to step S112.

Step S115: The procedure of steps S111–S114 is repeated until measurements to all the predetermined focus offset measurement sample shots are completed. Namely, a discrimination is made whether the last measurement shot is completed. If not, the sequence goes back to step S111.

Steps S120–S121 of FIG. 13 are the procedures to be made in step S12 of FIG. 9. That is:

Step S120: To the measurement points of the focus sensors, a global plane representing nine wafer surfaces is calculated from the measured values related to a total of four shots, with nine points in each shot. Namely, to the predetermined nine points, the amount of measurement correction with respect to the five measurement points of the focus sensors is calculated. A section of the thus determined global plane with the optical axis AX direction, is used as the correction amount to the focus measurement. Such a calculation of the focus measurement correction amount is performed to the five measurement points of the focus sensors. Since details of determining the correction amount is fully discussed in Japanese Laid-Open Paten Application, Laid-Open No. 102518/1990, only a general concept thereof is explained here.

Step S121: As regards the five measurement points of the focus sensors, the thus calculated focus measurement correction amounts of a total of forty-five (45), nine for each of the five measurement points, are obtained and they are memorized into a memory.

Steps S1300–S1312 of FIG. 13 and Steps S1320–S1325 of FIG. 14 are the procedures to be made in step S13 of FIG. 9. That is:

Step S1300: To a shot (e.g., a shot No. 1) to which the exposure process is going to be made, the following discrimination is done. At the exposure position, if one or more of the focus sensor measurement points are placed on the boundary between a pattern region of a wafer and an outside peripheral region having no pattern or, alternatively, if it or they are placed in such an outside peripheral region having no pattern or are placed off the wafer, the process of step S1310 is performed. If, at the exposure position, all the focus sensor measurement points are in a pattern region on the wafer, the process of step S1320 (FIG. 14) is performed. Namely, in step S1300, a discrimination is made whether the exposure shot is a peripheral shot or not. If not, the sequence jumps to step S1320.

Step S1301: The stage is moved so that the measurement points of the focus sensors are placed at the positions shown at shot No. 1, for example, of FIG. 11, that is, at the preparative measurement points as previously determined with respect to each shot as described hereinbefore.

Step S1302: At each of the five measurement points of the focus sensors, the position of the wafer surface with respect to the optical axis AX direction is measured. Namely, focus measurement is done at the five measurement points.

Step S1303: Of the focus measurement correction amounts as memorized into the memory at step S121, the correction amounts corresponding to the five measurement points at the positions shown at shot No. 1, for example, of FIG. 11 are read out. By using the thus read correction amounts, the measured values obtained by the measurement at step S1302 in relation to the five measurement points of the focus sensors are corrected.

Step S1304: From the measured values of the five measurement points of the focus sensors, now corrected by the correction at step S1303, the amount of tilt of the wafer surface at the position of shot No.1, for example, of FIG. 11 is calculated.

Step S1305: In accordance with the amount of tilt of the wafer surface as calculated at step S1304, the second driving means is actuated to move and adjust the tilt of the wafer surface at the position of shot No. 1, for example, of FIG. 11. This is called a leveling drive.

Step S1306: In order to maintain the tilt adjusted state provided by step S1305, a tilt adjusting mechanism of the second driving means is controlled. That is, the tilt of the second driving means is fixed. This is called a leveling lock.

Step S1307: The stage is moved from the position where shot No. 1, for example, of FIG. 11 is at the preparative measurement position to the position where shot No. 1, for example, is placed at the exposure position.

Step S1308: The position of the wafer surface with respect to the optical axis AX direction is measured, by using those focus sensor measurement points which are, at the exposure position, on the pattern region of the wafer (e.g., for shot No. 1, two measurement points 503 and 504 are used). That is, focus measurement is performed with the measurement points within the layout.

Step S1309: Of the focus measurement correction amounts memorized in the memory at step S121, those correction amounts to five measurement points which correspond to the positions of the dots shown in FIG. 12, are read out. Additionally, of these correction amounts, those which correspond to the two measurement points (e.g., for shot No. 1, the measurement points 503 and 504), are used to correct the measured values of the focus sensors 503 and 504 obtained at step S1309.

Step S1310: From the measured values of two measurement points (e.g., measured values of the focus sensors 503 and 504) now corrected by the correction at step S1309, the position of the wafer surface with respect to the optical axis AX direction, at the position of shot No. 1, is calculated. As regards the calculation of the wafer surface position in the optical axis AX direction, the value of the focus sensor 503 at the center of the shot may be adopted as the surface position. Alternatively, from the tilt amount of the wafer surface as calculated at step S1304 and from the values of the focus sensors 503 and 504 which are measured values at two measurement points within the shot, the position in the optical axis AX direction best suited for exposure of that shot as a whole may be predicted and calculated.

Step S1311: In accordance with the position of the wafer surface in the optical axis AX direction as calculated by step S1310, the second driving means is actuated to change and adjust the position of shot No. 1, for example, with respect to the optical axis AX direction. That is, the surface position of the wafer in the optical axis AX direction is adjusted. Here, the tilt state of the second driving means being controlled at step S1306 is held.

Step S1312: In order to maintain the position with respect to the optical axis AX direction having been adjusted at step S1311, a position adjusting mechanism of the second driving means with respect to the optical axis AX direction is controlled. Namely, the position in the optical axis AX direction by the second driving means is held fixed. This is called a focus lock, or leveling and a focus lock.

Step S140: An exposure process is performed to execute pattern transfer.

After completion of the exposure process, the procedure at steps S1300–S140 is repeated for exposure of a subsequent shot. This continues until the exposure of a last shot is completed.

Referring now to FIG. 14, a case wherein all the measurement points of the focus sensors are placed on a pattern region of a wafer, will be explained.

Step S1320: The stage is moved so that the measurement points of the focus sensor are placed at the positions shown at shot No. 14, for example, of FIG. 11. The thus adjusted position corresponds to a position to be assumed at the time of an exposure process. Thus, the stage is moved to an exposure position.

Step S1321: The position of the wafer surface with respect to the optical axis AX direction is measured, this being done with regard to each of the five measurement points of the focus sensor. That is, focus measurement is performed.

Step S1322: Of the focus measurement correction amounts memorized into the memory at step S121, those correction amounts of the five measurement points which correspond to the exposure position shown at shot No. 14, for example, of FIG. 11 are read out. By using the thus read correction amounts, the measured values of the five measurement points of the focus sensors having been obtained at step S1321 are corrected.

Step S1323: From the measured values of the five measurement points of the focus sensors, now corrected by the correction at step S1322, the amount of tilt of the wafer surface at a position corresponding to the exposure position shown at shot No. 14, for example, of FIG. 11, is calculated. Simultaneously, from the measured values of the five measurement points, the position of the wafer surface in the optical axis AX direction, at shot No. 14, is calculated. As regards the calculation of the wafer surface position in the optical axis AX direction, the value of the focus sensor 503 at the center of the shot may be adopted as the surface position. Alternatively, from the tilt amount of the wafer surface and from the measured values of the five points in the shot, as calculated simultaneously, the position in the optical axis AX direction best suited for exposure of that shot as a whole may be predicted and calculated.

Step S1324: In accordance with the amount of tilt and the position in the optical axis AX direction of the wafer surface, as calculated at step S1323, the position of shot No. 14, for example, in the optical axis AX direction is changed and adjusted, this being done by actuating the second driving means. This is called leveling.

Step S1325: In order to maintain the tilt and position in the optical axis AX direction, having been adjusted at step S1324, the position adjusting mechanism of the second driving means is controlled. Namely, the tilt and position in the optical axis AX direction of the second driving means is held fixed. This is called leveling and focus lock.

After step S1325, the exposure process at step S140 is performed.

In the flow of FIG. 9, the procedure at steps S11 and S12 is performed with respect to each wafer. However, generally the correction amounts to the measurement points of the focus sensors are dependent upon the wafer process and thus they are substantially constant. Therefore, in a case where in wafers of one lot are going to be exposed successively, the procedure of steps S11 and S12 may be performed only to a first wafer in the lot, such that steps S11 and S12 may be omitted to a second wafer and wafers following it. Correction amounts as determined in connection with the first wafer may be used in relation to the second wafer and succeeding wafers.

Further, since in this embodiment the pattern structure of the wafer in the detection zone of the focus sensor differs between that at the exposure position and that at the preparative measurement position, the correction amounts to the focus measured values of the focus sensors at the preparative measurement position are measured and calculated. However, on a occasion when, such as shown in FIG. 15, patterns of the same structures a, b and c are formed in one shot area and this is also the case with the other shots, if the amount of displacement between the exposure position and the preparative measurement position is an integral number of times the spacing between the patterns formed on the wafer, the same pattern structures come to the focus sensor detection zones of the focus sensors, both at the exposure position and at the preparative measurement position. Thus, it is no longer necessary to measure and calculate the focus measurement correction amounts of a total of forty five (45) in relation to the sample shots and through movement in eight directions, as in the present embodiment. Only measurement and calculation of five correction amounts to the focus measurement is sufficient.

Figure 16A:
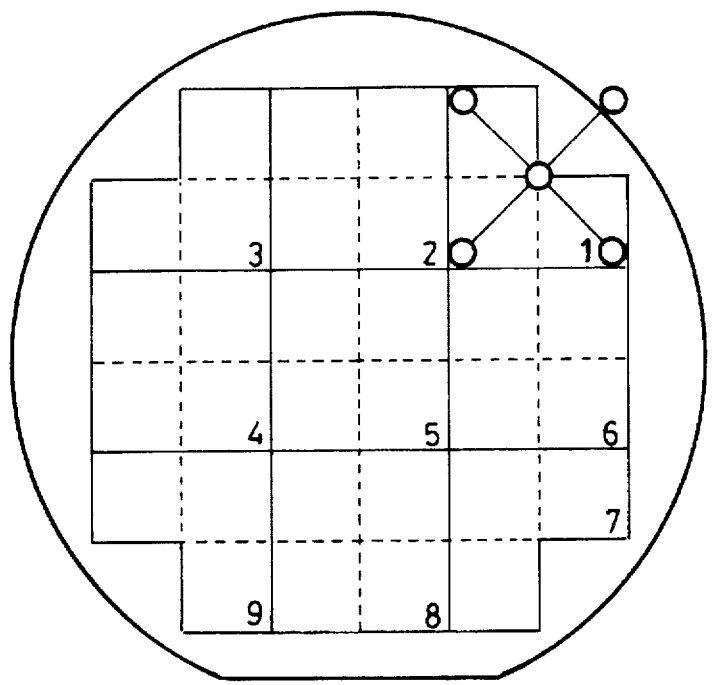
FIGS. 16A and 16B are schematic views, respectively, for explaining the focus sensor detection zone at the exposure position and that at the preparative measurement position, in the shot layout of FIG. 15, respectively.
Figure 16B:
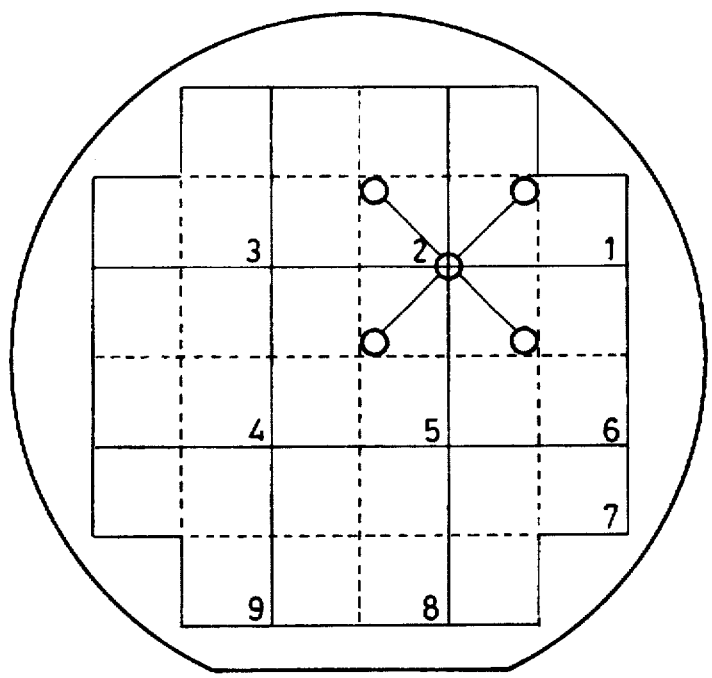

For example, the detection zones of the focus sensors at the exposure position of shot No. 1 in the peripheral portion of the wafer, are such as illustrated in FIG. 16A. This is a focus sensor which is off the layout. Here, if the preparative measurement position is shifted from the exposure position by a distance corresponding to the spacing of the patterns, then the state shown in FIG. 16B results. The pattern structure in the detection zones of the focus sensors is the same as the pattern structure in the detection zones of the focus sensors at the exposure position of shot No. 5 which is not in the peripheral portion of the wafer. Thus, only shot Nos. 2, 4, 5, 6 and 8 may be selected as sample shots, and measurement may be made to each shot as the same is at the exposure position.

Further, in this embodiment, tilt of a wafer at the preparative measurement position is measured and, on the basis of the measured value at that position, the tilt of the wafer is adjusted. However, the tilt of the wafer may be adjusted on the measured value before exposure of that shot, under examination, which moves from the preparative measurement position to the exposure position.

Also, while in this embodiment the invention is applied to an example of projection exposure wherein a circuit pattern of a reticle is projected on a wafer through a projection lens, the invention is applicable also to an exposure process of proximity type without using a projection lens. On that occasion, the words "position in the optical axis AX direction" should read "the position in the direction along the spacing between a wafer and a mask".

In this embodiment, a selection is made to the measurement results of the focus sensors at the alignment mark detecting position and, at that position, the position with respect to the optical axis direction is corrected. However, the surface position may be measured by using the focus sensors at a preparative measurement position, different from the alignment mark detecting position, and tilt and position of the wafer with respect to the optical axis may be corrected on the basis of the measured value. While keeping the thus corrected wafer attitude or, alternatively, while correcting the wafer attitude, the stage is moved from the preparative measurement position to the alignment mark detecting position. This is particularly effective when the detection with any of the focus sensors is not attainable at the alignment mark detecting position.

[Second Embodiment]

In the first embodiment, an effective measurement point or points is/are selected with respect to each measurement shot. However, one or those of the five measurement points for alignment measurement sample shots may be calculated beforehand with the console CS (FIG. 3), and they may be stored into a memory beforehand. Table 1 below shows effective measurement points in alignment shots, for wafer mark measurement in the Y direction. Table 2 below shows those for wafer mark measurement in the X direction. In these tables, the symbol "YES" denotes a focus sensor to be used, and the symbol "NO" denotes a focus sensor not to be used.

As a matter of course, this applies to the focus adjustment to exposure of a wafer peripheral shot.

TABLE 1

| Shot No.: | 501 | 502 | 503 | 504 | 505 |
|---|---|---|---|---|---|
| 11 | YES | NO | NO | YES | NO |
| 3 | NO | NO | NO | YES | NO |
| 17 | YES | NO | NO | YES | NO |
| 31 | YES | NO | NO | YES | NO |

TABLE 2

| Shot No.: | 501 | 502 | 503 | 504 | 505 |
|---|---|---|---|---|---|
| 11 | YES | YES | NO | NO | NO |
| 3 | YES | YES | NO | NO | NO |
| 17 | NO | YES | NO | NO | NO |
| 31 | YES | YES | NO | NO | NO |

[Third Embodiment]

In the first embodiment, an effective measurement point or points is/are selected for each alignment measurement shot. In this embodiment, as compared therewith, an approximate plane of a wafer is calculated from the surface position data in relation to all the measurement points. From the positional relationship among the positions of the measurement points of the focus sensors and the position of the detection zone of the mark detecting optical system, the surface position of the wafer in the detection zone of the mark detecting optical system is calculated. On the basis of the thus calculated position, the wafer 2 position with respect to the optical axis AX direction is corrected by using the second driving means of the stage driving means 12. As a matter of course, the surface position data of such a focus sensor whose measurement position is off the wafer is excluded. Also, for calculation of the approximate plane, the surface position data at the respective measurement positions may be weighted in accordance with the distance to the detection zone and that measurement point.

[Fourth Embodiment]

In the first to third embodiments, a difference among focus measured values attributable to any surface irregularities of the wafer is taken into consideration, only in relation to the exposure process. If this is taken into account also in relation to the alignment process, further improvement of precision is attainable.

How to correct the focus sensor measured values, in relation to the alignment process, will be explained below.

Figure 17:
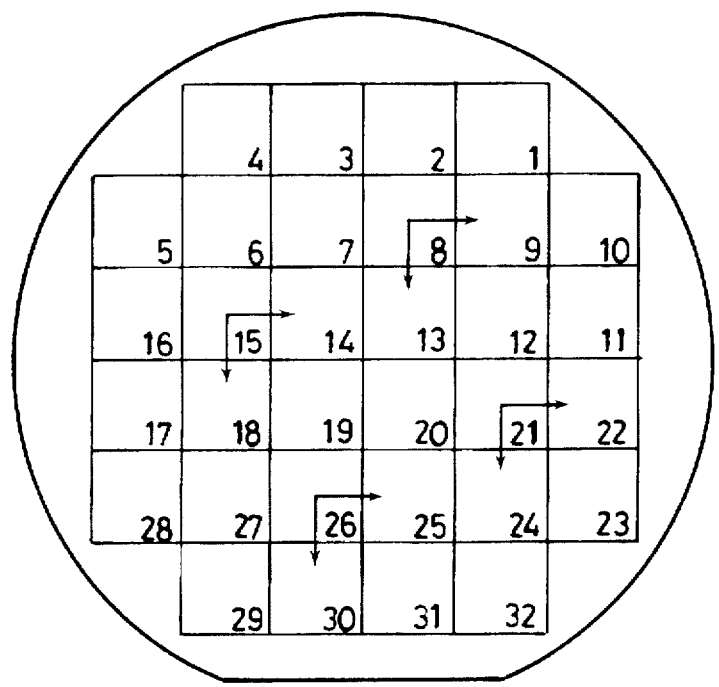
FIG. 17 is a schematic view for explaining displacement of an exposure position and a focus offset correction amount measurement position.

FIG. 17 illustrates the amount of displacement for focus offset correction amount measurement, in relation to the alignment process. Two directions as denoted by the arrows in the drawing depict displacement of the central position of the detection zones at five places of the focus sensors through movement of the stage.

In response to lateral movement denoted by a horizontal arrow, the mark Mx can be observed through the corresponding mark detection optical system. Also, in response to longitudinal movement denoted by a vertical arrow, the mark My can be observed through the corresponding mark detection optical system. The positions depicted by the arrows are such that, for example, the detection zones at five points of the focus sensors are within the layout, such as illustrated at shot No. 15 of FIG. 18 or 19, for example.

This case is an example wherein shot Nos. 8, 15, 26 and 21 are selected as sample shots for the focus offset correction amount measurement.

These sample shots are selected automatically once the number of sample shots is set through the console CS (FIG. 3) so that the detection zones at five points of the focus sensors all come into the layout with respect to the two movement positions.

Figure 18:
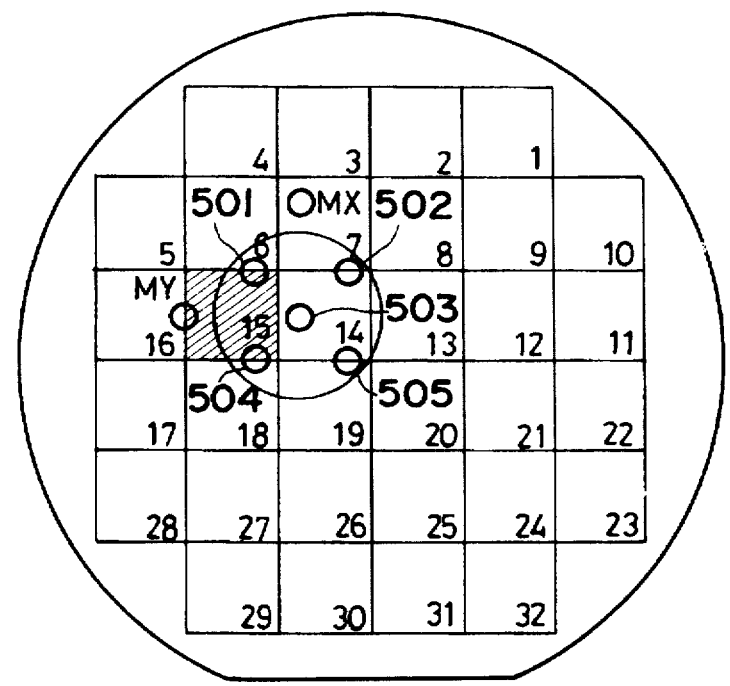
FIG. 18 is a schematic view for explaining a shot layout and a detection zone of focus sensor means.

FIG. 18 illustrates the positions of the detection zones at five points of the focus sensors at shot No. 15, for example, in the case of lateral movement along a horizontal arrow in FIG. 17.

Figure 19:
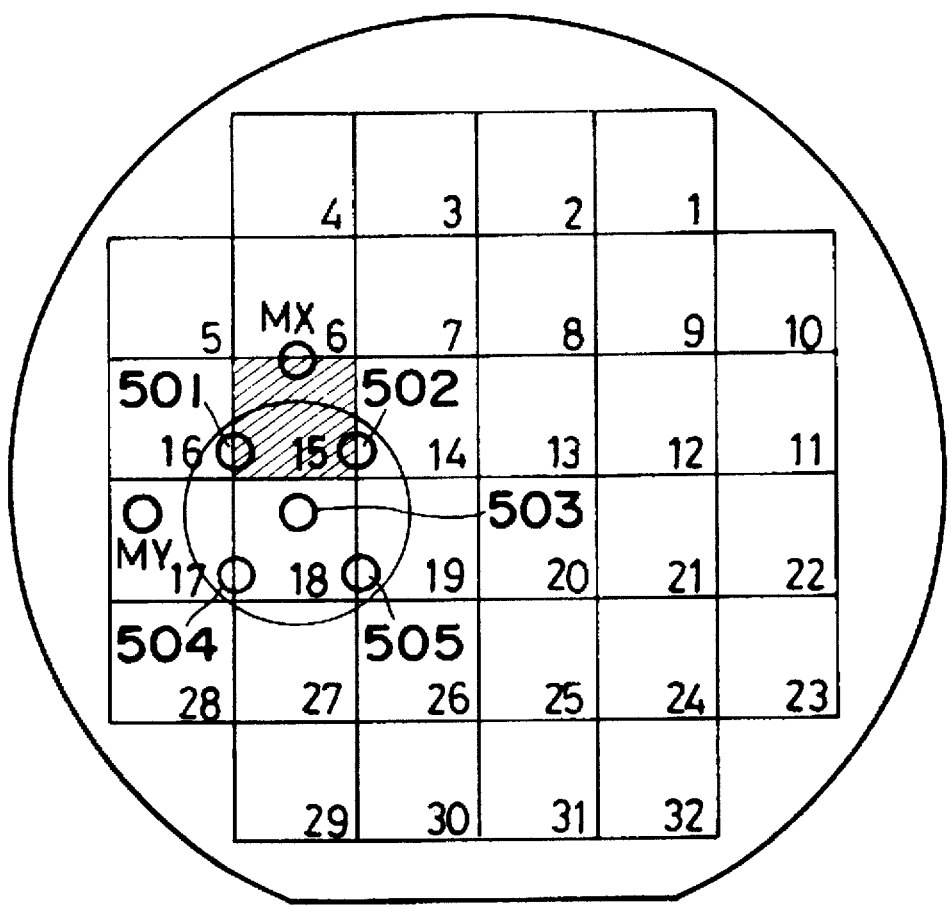
FIG. 19 is similar to FIG. 18, showing another example.

FIG. 19 illustrates the positions of the detection zones at five points of the focus sensors at shot No. 15, for example, in the case of longitudinal movement along a vertical arrow in FIG. 17.

Figure 20:
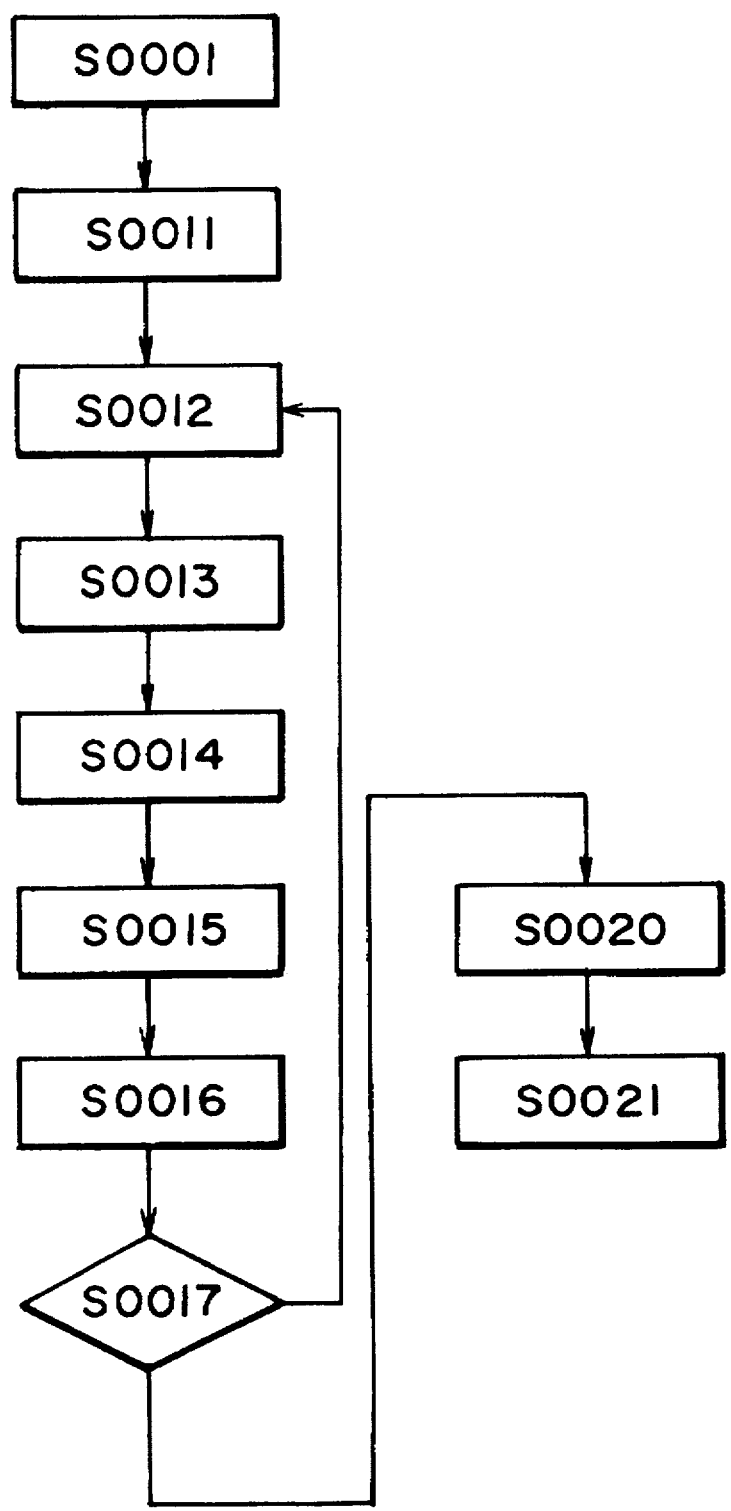
FIG. 20 is a flow chart for explaining details of focus offset correction amount measurement.

FIG. 20 is a flow chart for explaining details of the focus offset correction amount measurement, for an alignment process.

The measurement procedure in this flow chart is to be performed prior to step S01 of FIG. 9.

Step S001: Usually, before alignment measurement operations at steps S1–S09, marks (not shown) formed on a wafer are observed through a rough-detection microscope (not shown), provided adjacent to the stage, and the wafer having patterns is roughly brought into alignment with the exposure apparatus. This is called wafer prealignment. The rough-detection microscope serves to observe a mark. separately without intervention of a reduction projection lens, and it is used for the purpose that the mark is assuredly placed within the viewfield of the mark observing optical system such as shown in FIG. 3.

The procedure at steps S0011–S0017 corresponds to that of steps S110–S115 of FIG. 13, and the procedure at steps S0020–S0021 corresponds to that of steps S120–S121 of FIG. 13. That is:

Step S0011: The attitude of the wafer is held fixed with the second driving means, with respect to tilt and position with respect to the optical axis AX direction.

Step S0012: The stage is moved to a sample shot position.

Step S0013: The stage is moved to the objective Mx position.

Step S0014: The position of the wafer surface with respect to the optical axis AX direction is measured, this being done with respect to each of the measurement points of the focus sensors.

Step S0015: The stage is moved to the objective My position.

Step S0016: The wafer position with respect to the optical axis AX direction is measured, this being done with respect to each of the measurement points of the focus sensors.

Step S0017: Discrimination is made whether the last measurement shot is completed. If not, the sequence goes back to step S0012.

Step S0020: To the objective Mx and My positions, correction amounts to the five measurement points of the focus sensors are calculated.

Step S0021: The thus calculated correction amounts to the five measurement points of the focus sensors, to the objective Mx and My positions, are memorized into a memory.

Further detailed description of the procedure will be omitted here.

The correction amounts stored into the memory at step S0021 is used at step S03 and step S07, for measurement of the surface position through the focus sensors.

The manner of reflecting the thus obtained correction amounts is essentially the same as is done in steps S1303, S1309 and S1322. Thus, detailed description of it will be omitted here.

[Fifth Embodiment]

Now, an embodiment of a semiconductor device manufacturing method according to the present invention, which uses any one of the exposure methods described above, will be explained.

Figure 21:
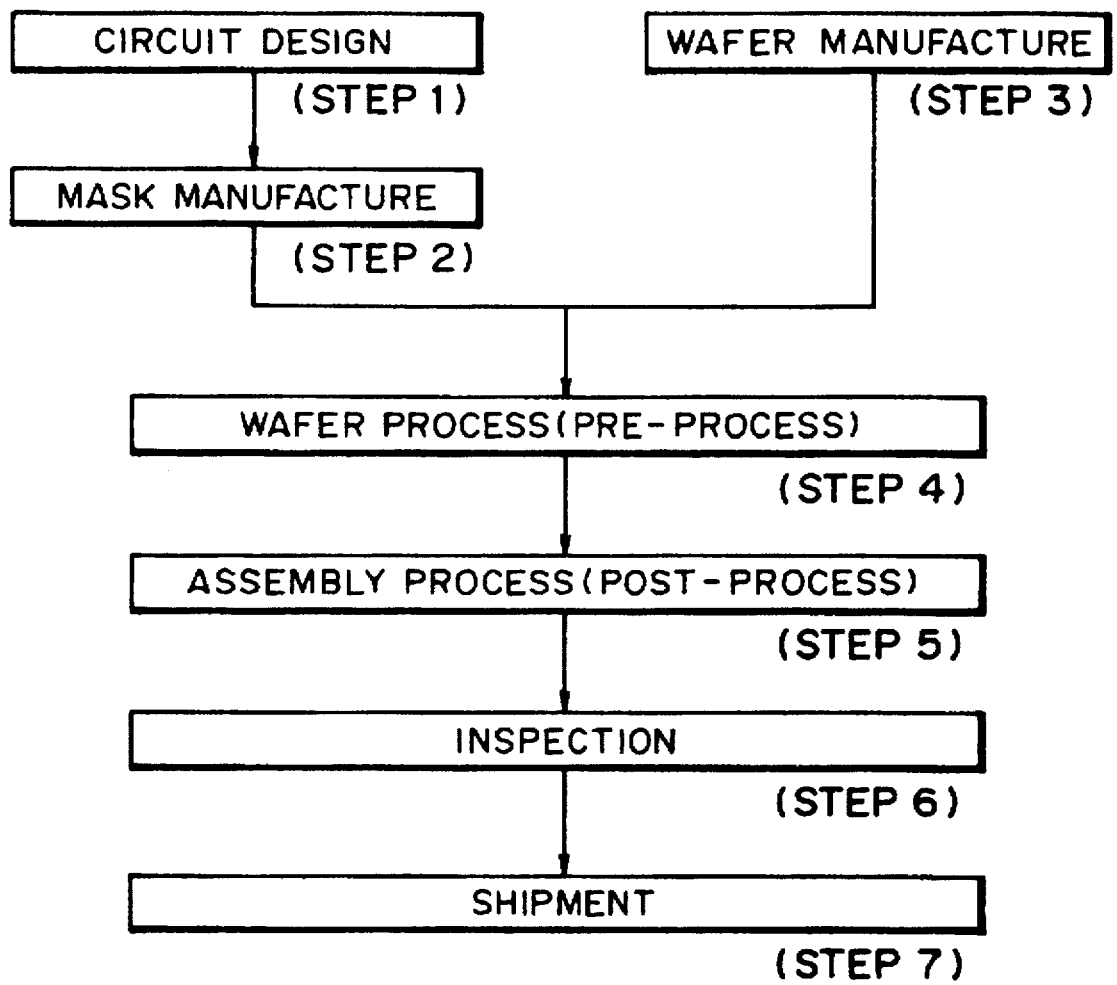
FIG. 21 is a flow chart of device manufacturing processes.

FIG. 21 is a flow chart of the sequence of manufacturing a semiconductor device such as a semiconductor chip (e.g., IC or an LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

FIG. 22 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure method for use with an exposure apparatus which includes a projection optical system for projecting a pattern of a first object onto a second object, a mark position detecting optical system having a detection zone at a predetermined position with respect to the projection optical system, for detecting a position of a mark formed on the second object with respect to a direction perpendicular to the axis of the projection optical system, and a plurality of surface position detecting devices having different detection zones at different positions predetermined with respect to the projection optical system, for detecting a surface position of the second object with respect to a direction of the axis of the projection optical system, said method comprising the steps of:

placing the mark within the direction zone of the mark position detecting optical system;

detecting the surface position of the second object by using the surface position of the detecting devices, wherein plural detection results are produced by the surface position detecting devices, respectively;

determining a deviation between the mark and a focal plane of the mark position detecting optical system on the basis of (i) the results of the detection of the surface position and (ii) the positional relationship among the detection zone of the mark position detecting optical system and the detection zones of the surface position detecting devices;

adjusting the surface position of the second object on the basis of the determined deviation; and detecting, after the adjustment in said adjusting step, the position of the mark through the mark position detecting optical system.

2. A method according to claim 1, wherein said determining step includes selecting at least one of the results of the detection in said detecting step, on the basis of a predetected position of the mark of the second object.

3. A method according to claim 1, wherein said determining step includes weighting the results in said detecting step, in accordance with a distance between the detection zone of the mark position detecting optical system and the detection zones of the surface position detecting devices, and calculating the deviation.

4. A method according to claim 1, wherein said determining step includes calculating an approximate plane of the second object on the basis of the results in said detecting step, to determine the deviation.

5. An exposure apparatus, comprising:

a projection optical system for projecting a pattern of a first object onto a second object;

a mark position detecting optical system having a detection zone at a predetermined position with respect to said projection optical system, for detecting a position of a mark on the second object with respect to a direction perpendicular to the axis of the projection optical system;

a plurality of surface position detecting means having different detection zones at different positions being predetermined with respect to said projection optical system, for detecting a surface position of the second object with respect to a direction of the axis of the projection optical system;

driving means for moving the second object in a direction perpendicular to an optical axis of said projection optical system;

control means for actuating said driving means so as to place the mark within the detection zone of said mark position detecting optical system, wherein said control means detects the surface position of the second object with the use of said plural surface position detecting means and produces a plurality of detection results, and said control means determines a deviation between the mark and a focal plane of the mark detecting optical system on the basis of (i) the results of the surface position detection and (ii) the positional relationship among the detection zone of said mark position detecting optical system and the detection zones of said plural surface position detecting means;

adjusting means for adjusting the surface position of the second object on the basis of the determined deviation; and detecting means for detecting, after the adjustment by said adjusting means, the position of the mark through the mark position detecting optical system.

6. An apparatus according to claim 5, wherein said control means selects at least one of the detection results on the basis of a predetected position of the mark of the second object.

7. An apparatus according to claim 5, wherein said control means weights the detection results in accordance with a distance between the detection zone of said mark position detecting optical system and the detection zones of said plural surface position detecting means, and calculates the deviation.

8. An apparatus according to claim 5, wherein said control means calculates an approximate plane of the second object on the basis of the detection results to determine the deviation.

9. An exposure method for use with an exposure apparatus that includes an exposure system for sequentially moving a first object having arrayed exposure zones with the same pattern structure formed thereon and for printing a pattern of a second object on the exposure zones of the first object as the first object is sequentially fed to an exposure station, and surface position detecting means having different detection zones predetermined with respect to the exposure system, for detecting the surface position of the first object at different locations, said method comprising:

a first adjusting step for adjusting an attitude of a first exposure zone of the first object, which first exposure zone is in an inside portion of the array of the exposure zones, said first adjusting step comprising placing the first exposure zone of the first object at the exposure station and detecting the surface position of the first object, at different locations, through the surface position detecting means, and adjusting the surface position and tilt of the first object on the basis of the detection;

a second adjusting step for adjusting an attitude of a second exposure zone of the first object, which second exposure zone is in a peripheral portion of the array of the exposure zones, said second adjusting step comprising placing, at the exposure station, an auxiliary measurement region defined on the first object adjacent to the second exposure zone, detecting the surface position of the first object at different locations, through the surface position detecting means, adjusting tilt of the first object on the basis of the detection, placing, after the tilt adjustment, the second exposure zone of the first object at the exposure station, detecting the surface position of the first object through the surface position detecting means, and adjusting the surface position of the first object on the basis of the detection at the second exposure zone; and an exposure step, after said first or second adjusting step, for printing the pattern of the second object on the exposure zones.

10. A method according to claim 9, further comprising, when the second exposure zone of the first object is placed at the exposure station, detecting the surface position of the first object, at different locations, through the surface position detecting means whereby plural surface positions are determined, and adjusting the position of the first object with respect to a direction in which the first and second objects are opposed to each other, on the basis of at least one of the plural surface positions.

11. An exposure apparatus for sequentially moving a first object having arrayed exposure zones with the same pattern structure formed thereon and for printing a pattern of a second object on the exposure zones of the first object as the first object is sequentially fed to an exposure station, through an exposure system, said apparatus comprising:

first adjusting means for adjusting an attitude of a first exposure zone of the first object, which first exposure zone is in an inside portion of the array of the exposure zones, said first adjusting means placing the first exposure zone of the first object at the exposure station and detecting the surface position of the first object, at different locations, through surface position detecting means, and adjusting the surface position and tilt of the first object on the basis of the detection;

second adjusting means for adjusting an attitude of a second exposure zone of the first object, which second exposure zone is in a peripheral portion of the array of the exposure zones, said second adjusting means placing, at the exposure station, an auxiliary measurement region defined on the first object adjacent to the second exposure zone, detecting the surface position of the first object at different locations, through the surface position detecting means, adjusting tilt of the first object on the basis of the detection, placing, after the adjustment, the second exposure zone of the first object at the exposure station, detecting the surface position of the first object through the surface position detecting means, and adjusting the surface position of the first object on the basis of the detection at the second exposure zone; and exposure means for printing, after the adjustments by said first or second adjusting means, the pattern of the second object on the exposure zones.

12. An apparatus according to claim 11, wherein, when the second exposure zone of the first object is placed at the exposure station the surface position of the first object is detected, at different locations, through the surface position detecting means whereby plural surface positions are determined, and further comprising adjusting means for adjusting the position of the first object with respect to a direction in which the first and second objects are opposed to each other, on the basis of at least one of the plural surface positions.

13. A device manufacturing method for manufacturing devices by use of an exposure apparatus that includes an exposure system for sequentially moving a resist-coated wafer having arrayed exposure zones with the same pattern structure formed thereon and for printing a pattern of a mask on the exposure zones of the wafer as the wafer is sequentially fed to an exposure station, and surface position detecting means having different detection zones being predetermined with respect to the exposure system, for detecting the surface position of the wafer at the different locations, said method comprising:

a first adjusting step for adjusting an attitude of a first exposure zone of the wafer, which first exposure zone is in an inside portion of the array of the exposure zones, said first adjusting step comprising placing the first exposure zone of the wafer at the exposure station and detecting the surface position of the wafer, at different locations, through the surface position detecting means, and adjusting the surface position and tilt of the wafer on the basis of the detection; and a second adjusting step for adjusting an attitude of a second exposure zone of the wafer, which second exposure zone is in a peripheral portion of the array of the exposure zones, said second adjusting step comprising placing, at the exposure station, an auxiliary measurement region defined on the wafer adjacent to the second exposure zone, detecting the surface position of the wafer at different locations, through the surface position detecting means, adjusting tilt of the wafer on the basis of the detection, placing, after the adjustment, the second exposure zone of the wafer at the exposure station, detecting the surface position of the first object through the surface position detecting means, and adjusting the surface position of the first object on the basis of the detection at the second exposure zone; and an exposure step, after said first or second adjusting step, for printing the pattern of the second object on the exposure zones.

\* \* \* \* \*

UNITED STATES PATENT AND TRADEMARK OFFICE
CERTIFICATE OF CORRECTION

PATENT NO. : 5,751,428

DATED : May 12, 1998

INVENTOR(S): YOSHIHARU KATAOKA, ET AL.

It is certified that error appears in the above-identified patent and that said Letters Patent is hereby corrected as shown below:

IN THE DRAWINGS:

Replace sheet 1 ("FIG. 1"), sheet 2 ("FIG. 2"), sheet 7 ("FIG. 9") and sheet 17 ("FIG. 22") with Figures 1, 2, 9 and 22, respectively, as shown on the following four sheets.

COLUMN 1:

line 11, "a" should be deleted; and
line 13, "wafer" should read --a wafer--.

COLUMN 2:

line 54, "apparatus:" should read --apparatus--.

COLUMN 4:

line 56, "of detection of the" should read --of the detection of--; and
line 64, "through an through an" should read --through an--.

UNITED STATES PATENT AND TRADEMARK OFFICE
CERTIFICATE OF CORRECTION

PATENT NO. : 5,751,428

DATED : May 12, 1998

INVENTOR(S) : YOSHIHARU KATAOKA, ET AL.

It is certified that error appears in the above-identified patent and that said Letters Patent is hereby corrected as shown below:

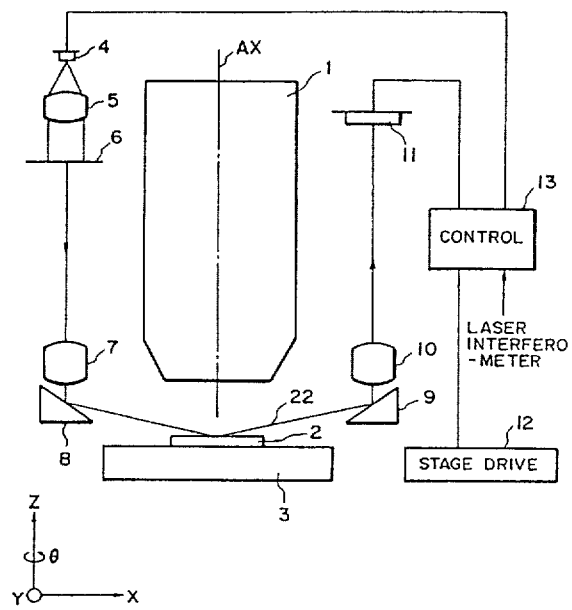

FIG. 1
PRIOR ART

UNITED STATES PATENT AND TRADEMARK OFFICE
CERTIFICATE OF CORRECTION

PATENT NO. : 5,751,428

DATED : May 12, 1998

INVENTOR(S) : YOSHIHARU KATAOKA, ET AL.         Page 3 of 7

It is certified that error appears in the above-identified patent and that said Letters Patent is hereby corrected as shown below:

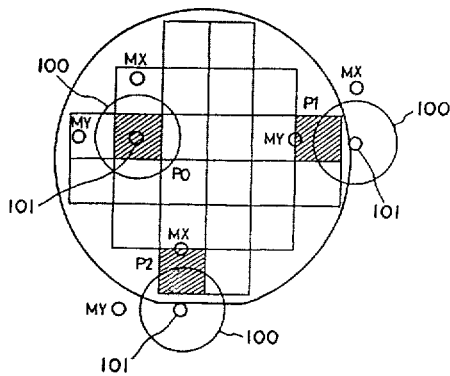

FIG. 2
PRIOR ART

UNITED STATES PATENT AND TRADEMARK OFFICE
CERTIFICATE OF CORRECTION

PATENT NO. : 5,751,428

DATED : May 12, 1998

INVENTOR(S) : YOSHIHARU KATAOKA, ET AL.

Page 4 of 7

It is certified that error appears in the above-identified patent and that said Letters Patent is hereby corrected as shown below:

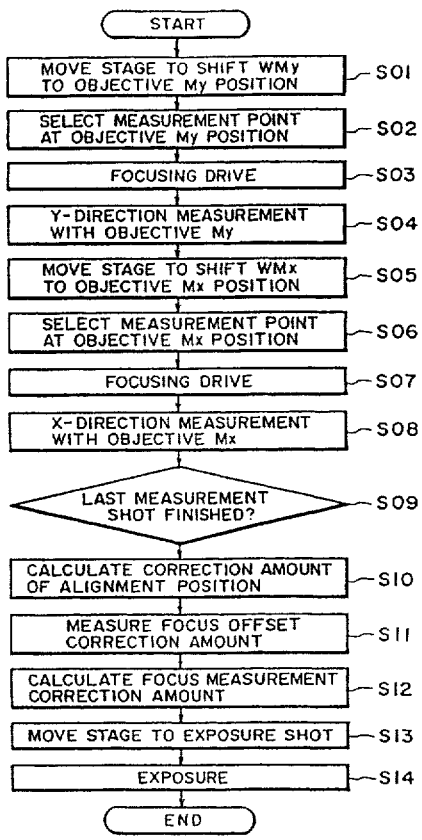

FIG. 9

UNITED STATES PATENT AND TRADEMARK OFFICE
CERTIFICATE OF CORRECTION

PATENT NO. : 5,751,428

DATED : May 12, 1998

INVENTOR(S) : YOSHIHARU KATAOKA, ET AL.          Page 5 of 7

It is certified that error appears in the above-identified patent and that said Letters Patent is hereby corrected as shown below:

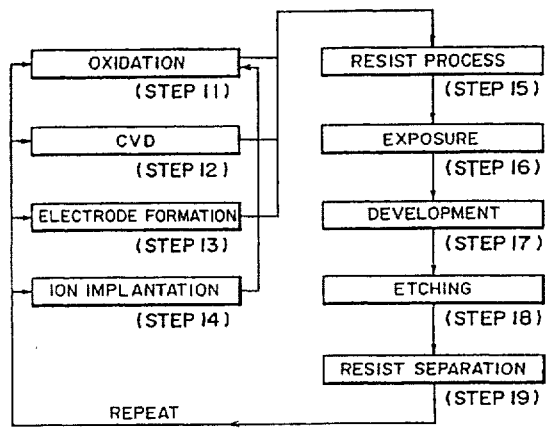

FIG. 22

UNITED STATES PATENT AND TRADEMARK OFFICE
CERTIFICATE OF CORRECTION

PATENT NO. : 5,751,428

DATED : May 12, 1998

INVENTOR(S): YOSHIHARU KATAOKA, ET AL.

It is certified that error appears in the above-identified patent and that said Letters Patent is hereby corrected as shown below:

COLUMN 7:

line 62, "of air" should read --of an air--.

COLUMN 9:

line 28, "corrected. Step S08:" should read --corrected. ¶ Step S08:--; and
    line 61, "a t" should read --at--.

COLUMN 10:

line 27, "as" should read --as that--;
    line 28, "movement" should read --movement,-- and "that the" should read --the--.

COLUMN 11:

line 7, "these" should read --there--.

UNITED STATES PATENT AND TRADEMARK OFFICE
CERTIFICATE OF CORRECTION

PATENT NO.   :   5,751,428

DATED        :   May 12, 1998

INVENTOR(S)  :   WOSHIHARU KATAOKA, ET AL.

It is certified that error appears in the above-identified patent and that said Letters Patent is hereby corrected as shown below:

COLUMN 14:

line 27, "where in" should read --wherein--.

COLUMN 15:

line 35, "or" should read --of--.

COLUMN 18:

line 39, "direction" should read --detection--.

Signed and Sealed this

Fifth Day of January, 1999

Attest:

*Attesting Officer*    *Acting Commissioner of Patents and Trademarks*